(12) United States Patent
Kim

(10) Patent No.: US 12,557,355 B2
(45) Date of Patent: Feb. 17, 2026

(54) STACK TYPE SEMICONDUCTOR DEVICE

(71) Applicant: SAMSUNG ELECTRONICS CO., LTD., Suwon-si (KR)

(72) Inventor: Chaelyoung Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 682 days.

(21) Appl. No.: 17/879,176

(22) Filed: Aug. 2, 2022

(65) Prior Publication Data

US 2023/0116288 A1  Apr. 13, 2023

(30) Foreign Application Priority Data

Oct. 12, 2021 (KR) .......................... 10-2021-0135304

(51) Int. Cl.
*H10D 62/10* (2025.01)
*H01L 23/48* (2006.01)
(Continued)

(52) U.S. Cl.
CPC ......... *H10D 62/118* (2025.01); *H01L 23/481* (2013.01); *H10D 64/251* (2025.01);
(Continued)

(58) Field of Classification Search
CPC ........ H10D 30/43; H10D 30/47; H10D 30/62; H10D 30/6211; H10D 30/6217; H10D 30/6218; H10D 30/6219; H10D 30/6733; H10D 30/6734; H10D 30/6735; H10D 30/6748; H10D 30/6757; H10D 30/504; H10D 30/506; H10D 30/019–0198; H01L 25/074; H01L 25/117
See application file for complete search history.

(56) References Cited

U.S. PATENT DOCUMENTS 8,264,042 B2   9/2012   Xiao et al.
8,492,220 B2   7/2013   Erickson et al.
(Continued)

FOREIGN PATENT DOCUMENTS

KR   10-2018-0103423 A   9/2018
KR   10-2020-0032940 A   3/2020
KR   10-2020-0136230 A   12/2020

OTHER PUBLICATIONS

Notice of Allowance dated Nov. 20, 2025 issued in corresponding to Korean Patent Application No. 10-2021-0135304.

*Primary Examiner* — Britt D Hanley
*Assistant Examiner* — Jason James Greaving
(74) *Attorney, Agent, or Firm* — Morgan, Lewis & Bockius LLP

(57) ABSTRACT

A stack-type semiconductor device includes: a first nanosheet stack structure arranged on a substrate; a first source/drain region extending on a side surface of the first nanosheet stack structure; a second nanosheet stack structure stacked on the first nanosheet stack structure; a second source/drain region extending on a side surface of the second nanosheet stack structure; a contact hole adjacent to a side surface of the second source/drain region and a side surface of the first source/drain region and extending in a vertical direction with respect to a surface of the substrate; and a contact electrode disposed in the contact hole, wherein the contact electrode contacts the side surface of the first source/drain region.

13 Claims, 17 Drawing Sheets

(51) Int. Cl.
*H10D 64/23* (2025.01)
*H10D 84/03* (2025.01)
*H10D 88/00* (2025.01)

(52) U.S. Cl.
CPC ........... *H10D 84/038* (2025.01); *H10D 88/00* (2025.01); *H10D 88/01* (2025.01)

(56) References Cited

U.S. PATENT DOCUMENTS

| | | |
|---|---|---|
| 9,773,913 B1 | 9/2017 | Balakrishnan et al. |
| 9,831,131 B1 | 11/2017 | Jacob |
| 10,483,166 B1 | 11/2019 | Cheng et al. |
| 10,770,479 B2 | 9/2020 | Smith et al. |
| 10,811,415 B2 | 10/2020 | Sengupta et al. |
| 10,971,417 B2 | 4/2021 | Yu et al. |
| 2020/0098859 A1* | 3/2020 | Reboh ................ H10D 84/834 |
| 2020/0203341 A1 | 6/2020 | Barraud et al. |
| 2022/0109046 A1* | 4/2022 | Hong ................ H10D 84/0167 |
| 2022/0301936 A1* | 9/2022 | Merchant ............ H10D 62/121 |
| 2022/0415708 A1* | 12/2022 | Mehandru ............ H10D 84/83 |

\* cited by examiner

STACK TYPE SEMICONDUCTOR DEVICE

CROSS-REFERENCE TO RELATED APPLICATION

This application claims priority under 35 U.S.C. § 119 to Korean Patent Application No. 10-2021-0135304, filed on Oct. 12, 2021, in the Korean Intellectual Property Office, the disclosure of which is incorporated by reference herein in its entirety.

TECHNICAL FIELD

The present inventive concept relates to a semiconductor device, and more particularly, to a stack-type semiconductor device.

DISCUSSION OF THE RELATED ART

Currently, stack-type semiconductor devices, in which upper and lower transistors are not stacked into planar transistors, but, instead, are stacked in cubic transistors, for example, three-dimensional (3D) transistors. In a stack-type semiconductor device including 3D transistors, it may be difficult to easily form a contact electrode that is electrically connected to a source/drain area of a lower transistor that is on a lower portion of the stack-type semiconductor device.

SUMMARY

According to an exemplary embodiment of the present inventive concept, a stack-type semiconductor device includes: a first nanosheet stack structure arranged on a substrate; a first source/drain region extending on a side surface of the first nanosheet stack structure; a second nanosheet stack structure stacked on the first nanosheet stack structure; a second source/drain region extending on a side surface of the second nanosheet stack structure; a contact hole adjacent to a side surface of the second source/drain region and a side surface of the first source/drain region and extending in a vertical direction with respect to a surface of the substrate; and a contact electrode disposed in the contact hole, wherein the contact electrode contacts the side surface of the first source/drain region.

According to an exemplary embodiment of the present inventive concept, a stack-type semiconductor device includes: a first nanosheet stack structure arranged on a substrate; a first source/drain region disposed on a side surface of the first nanosheet stack structure; a second nanosheet stack structure stacked on the first nanosheet stack structure; a second source/drain region disposed on a side surface of the second nanosheet stack structure; a contact hole contacting a first side surface of the second source/drain region and a first side surface of the first source/drain region, and extending in a vertical direction with respect to a surface of the substrate; and a contact electrode disposed in the contact hole, wherein the contact electrode directly contacts the first side surface of the first source/drain region.

According to an exemplary embodiment of the present inventive concept, a stack-type semiconductor device includes: a first nanosheet stack structure arranged on a substrate in a first direction with respect to a surface of the substrate; a first source/drain region extending on a side surface of the first nanosheet stack structure in a second direction intersecting the first direction; a second nanosheet stack structure stacked on the first nanosheet stack structure in the first direction; a second source/drain region extending on a side surface of the second nanosheet stack structure in the first direction; an intermediate hole adjacent to the first source/drain region and extending in the second direction; an intermediate electrode disposed in the intermediate hole and contacting the first source/drain region; and a contact hole overlapping a side surface of the intermediate electrode and a side surface of the second source/drain region and extending in the first direction; and a contact electrode disposed in the contact hole, wherein the contact electrode indirectly contacts a side surface of the first source/drain region through the intermediate electrode.

BRIEF DESCRIPTION OF THE DRAWINGS

The above and other aspects of the present inventive concept will become more apparent by describing in detail embodiments thereof, with reference to the accompanying drawings, in which.

DETAILED DESCRIPTION OF THE EMBODIMENTS

Figure 1:
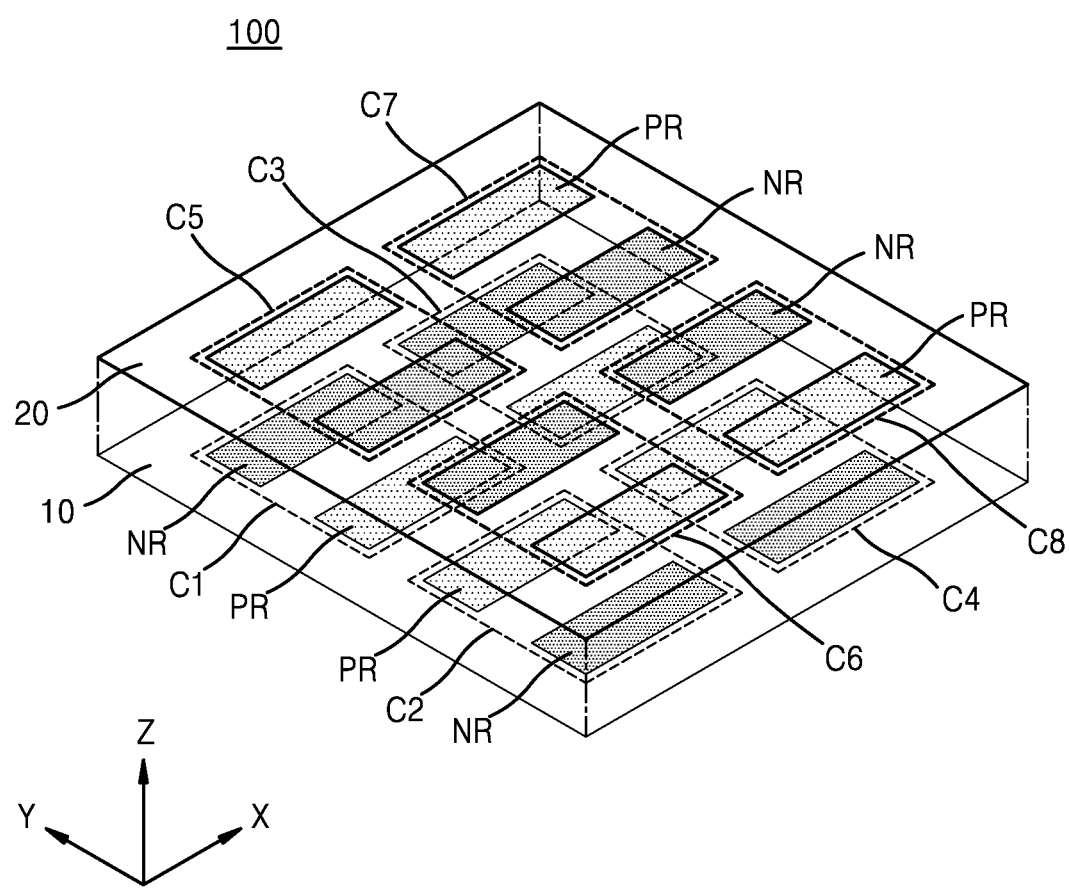
FIG. 1 illustrates a layout of a stack-type semiconductor device according to an exemplary embodiment of the present inventive concept.

Hereinafter, exemplary embodiments of the present inventive concept will be described in detail with reference to the attached drawings. Like reference numerals in the drawings denote like elements, and repeated or redundant descriptions thereof may be omitted.

FIG. 1 illustrates a layout of a stack-type semiconductor device according to an embodiment of the present inventive concept.

For example, a stack-type semiconductor device 100 includes a first level layer 10 and a second level layer 20 stacked on the first level layer 10. The first level layer 10 may include first to fourth logic cells C1 to C4 provided on a substrate. The first level layer 10 includes the first to fourth logic cells C1 to C4, but the present inventive concept is not limited thereto.

The second level layer 20 may include fifth to eighth logic cells C5 to C8 stacked on the first level layer 10. The second level layer 20 includes the fifth to eighth logic cells C5 to C8, but the present inventive concept is not limited thereto. Each of the first to eighth logic cells C1 to C8 may indicate a unit or circuit for performing a logic operation.

Each of the first to eighth logic cells C1 to C8 may include metal oxide semiconductor (MOS) transistors. Each of the first to eighth logic cells C1 to C8 may include an active region or an active pattern separated by a device isolation layer. Each of the first to eighth logic cells C1 to C8 may include a first region PR and a second region NR.

The first region PR may be a region where a first transistor TR1, for example, a P-type transistor, may be formed. The first transistor TR1 may be a MOS transistor. The first region PR may be a region where a three-dimensional transistor, for example, a P-type multi-bridge channel transistor MBC1, may be formed.

The second region NR may be a region where a second transistor TR2, for example, an N-type transistor, may be formed. The second transistor TR2 may be a MOS transistor. The second region NR may be a region where a three-dimensional transistor, for example, an N-type multi-bridge channel transistor MBC2, may be formed.

On the first and second level layers 10 and 20, the first region PR and the second region NR may be spaced apart from each other in a horizontal direction (e.g., an X direction and a Y direction). For example, the first region PR of the first level layer 10 may overlap the second region NR of the second level layer 20 in a vertical direction (e.g., a Z direction). In addition, the second region NR of the first level layer 10 may overlap the first region PR of the second level layer 20 in the vertical direction (e.g., the Z direction).

Figure 2:
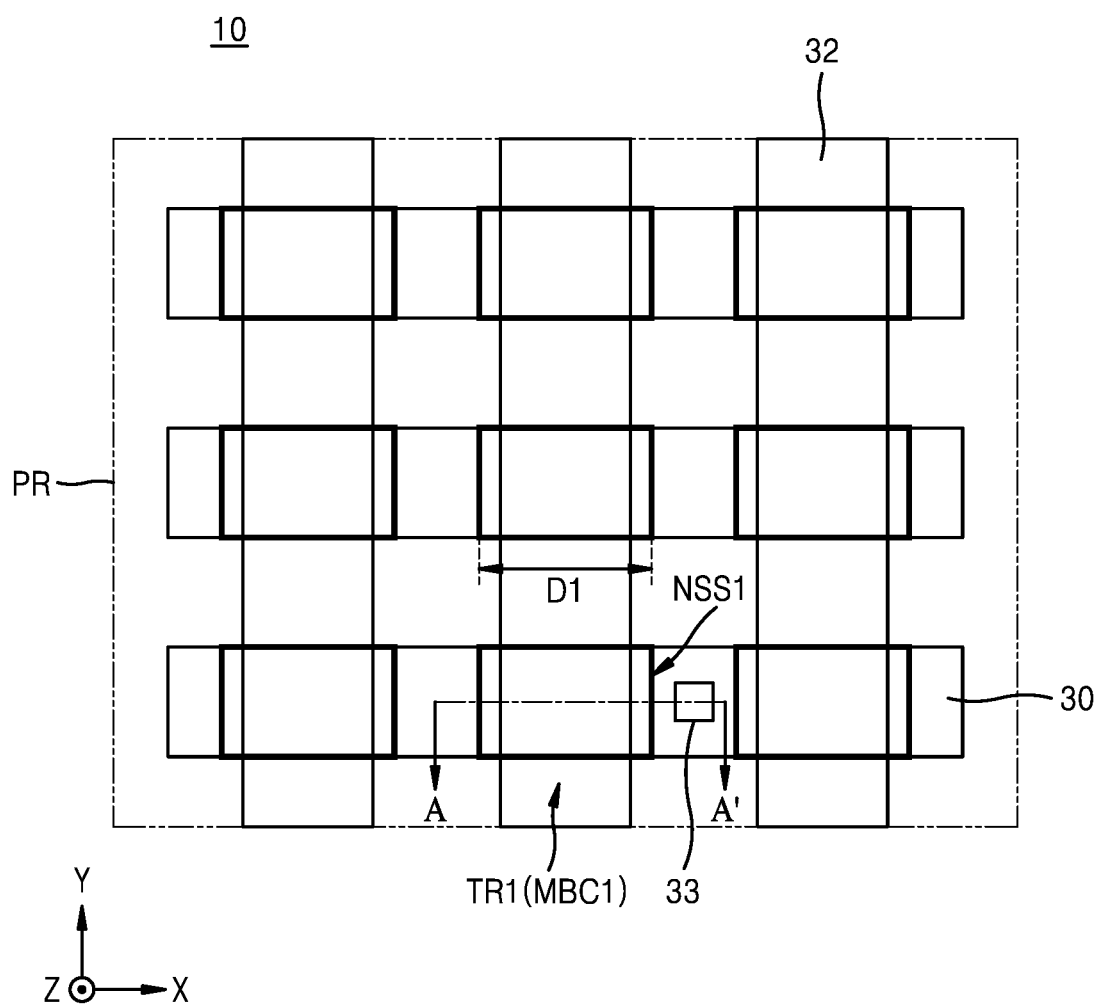
FIG. 2 illustrates a partial layout of a first level layer of a stack-type semiconductor device, according to an exemplary embodiment of the present inventive concept.

FIG. 2 illustrates a partial layout of a first level layer of a stack-type semiconductor device, according to an exemplary embodiment of the present inventive concept.

In detail, FIG. 2 may illustrate a partial layout of the first region PR of the first level layer 10 of the stack-type semiconductor device 100 of FIG. 1. In FIG. 2, the X direction may be a channel-length direction, and the Y direction, which is perpendicular to the X direction, may be a channel-width direction. The layout of the first region PR of the first level layer 10 is not limited to FIG. 2, and the present inventive concept is not limited to the layout of FIG. 2.

The first region PR may include a plurality of active fins 30 extending in the X direction and spaced apart from each other in the Y direction. The first region PR may include a plurality of first gate electrodes 32 that extend in the Y direction and are spaced apart from each other in the X direction.

In the first region PR, the first gate electrodes 32 may be arranged on the active fins 30. In the first region PR, first nanosheet stack structures NSS1 may respectively be arranged on overlapping portions in which the active fins 30 cross the first gate electrodes 32.

The first nanosheet stack structure NSS1 may have a first length D1 in the X direction. As described below, the first nanosheet stack structure NSS1 may include a plurality of first nanosheets (NS1 of FIG. 4).

The active fins 30 and the first nanosheets (NS1 of FIG. 4) may provide an active region of the first transistor TR1, for example, the P-type multi-bridge channel transistor MBC1. A detailed structure of the first nanosheet stack structure NSS1 is described below in detail.

On one side of the first nanosheet stack structure NSS1, a first source/drain contact region 33 may be located. There may be various contact regions in the first region PR, but for convenience, FIG. 2 only illustrates the first source/drain contact region 33.

Figure 3:
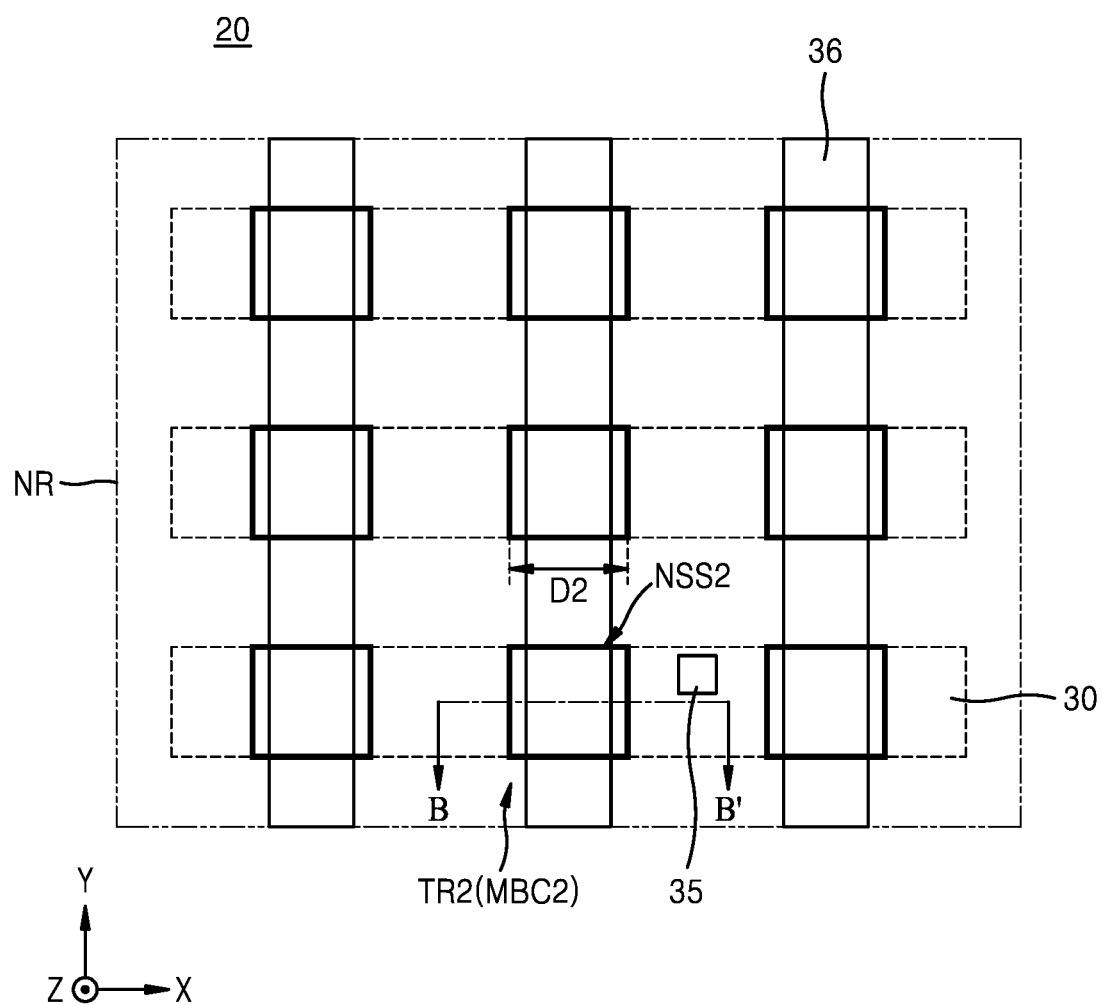
FIG. 3 illustrates a partial layout of a second level layer of a stack-type semiconductor device, according to an exemplary embodiment of the present inventive concept.

FIG. 3 illustrates a layout of a second level layer of a stack-type semiconductor device, according to an embodiment of the present inventive concept.

In detail, FIG. 3 may illustrate a partial layout of the second region NR of the second level layer 20 of the stack-type semiconductor device 100 of FIG. 1. In FIG. 2, the X direction may be the channel-length direction, and the Y direction may be the channel-width direction. The layout of the second level layer 20 is not limited to FIG. 3, and the present inventive concept is not limited to the layout of FIG. 3.

The second region NR may include a plurality of second gate electrodes 36 extending in the Y direction and are spaced apart from each other in the X direction. In the second region NR, second nanosheet stack structures NSS2 may be arranged in overlapping portions in which the active fins 30 respectively cross the second gate electrodes 36.

The second nanosheet stack structure NSS2 may have a second length D2 that is less than the first length D1 in the X direction. As described below, the second nanosheet stack structure NSS2 may include a plurality of second nanosheets (NS2 of FIG. 4). The second nanosheets (NS2 of FIG. 4) may provide an active area of the second transistor TR2, for example, the N-type multi-bridge channel transistor MBC2. The structure of the second nanosheet stack structure NSS2 is described below in detail.

On one side of the second nanosheet stack structure NSS2, a second source/drain contact region 35 may be located. There may be various contact regions, but for convenience, FIG. 3 only illustrates the second source/drain contact region 35. The second source/drain contact region 35 might not overlap, in the vertical direction (e.g., the Z direction), the first source/drain contact region 33 of the first level layer 10 of FIG. 2 that is described above.

In an exemplary embodiment of the present inventive concept, the second source/drain contact region 35 may at least partially overlap, in the vertical direction (e.g., the Z direction), the first source/drain contact region 33 of the first level layer 10 of FIG. 2.

Figure 4:
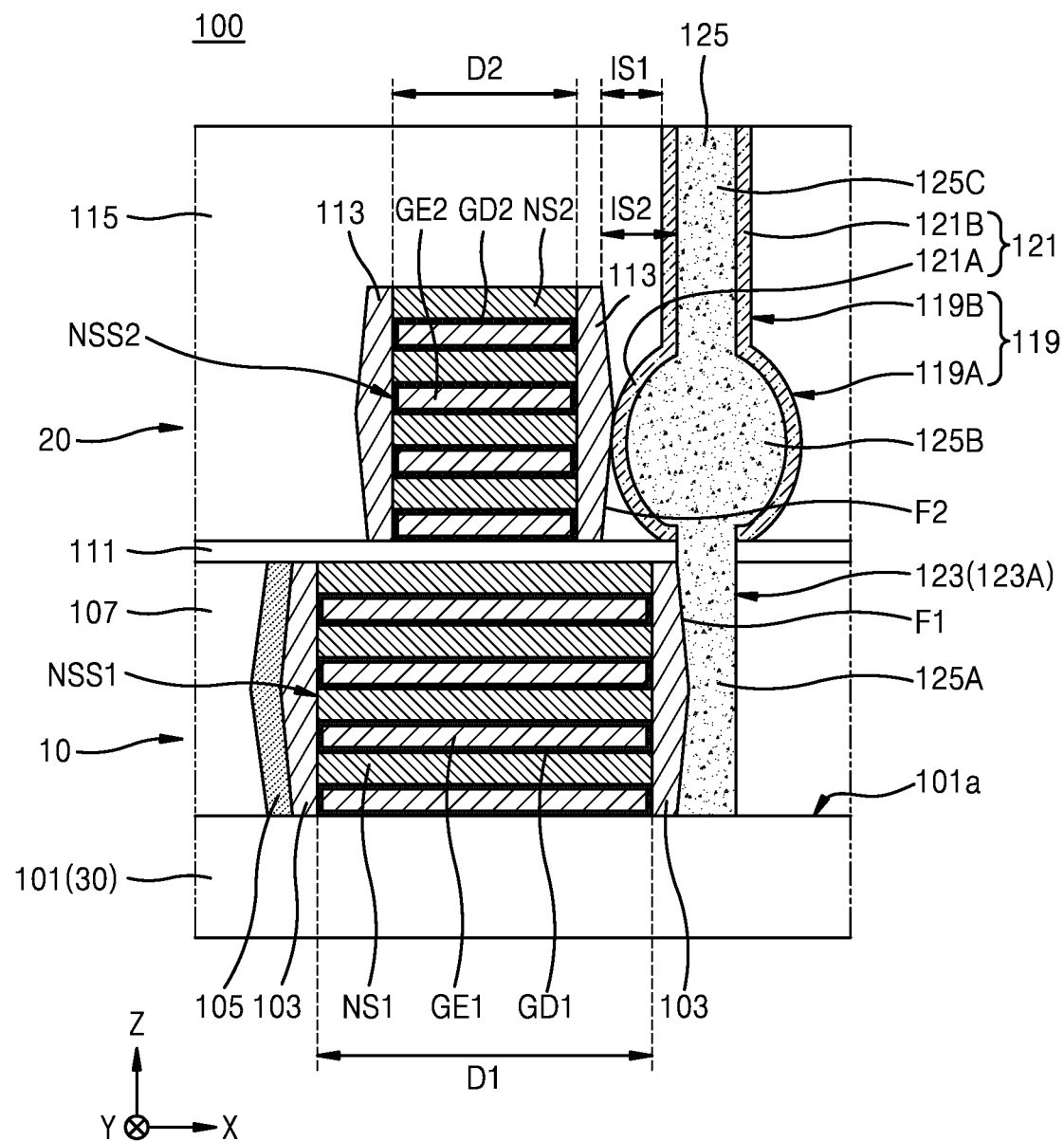
FIG. 4 is a cross-sectional view of a stack-type semiconductor device according to an exemplary embodiment of the present inventive concept.

FIG. 4 is a cross-sectional view of a stack-type semiconductor device according to an exemplary embodiment of the present inventive concept.

In detail, FIG. 4 may be a partial cross-sectional view of the stack-type semiconductor device 100 of FIG. 1. FIG. 4 may be a partial cross-sectional view illustrating that the second level layer 20 is stacked on the first level layer 10 in the stack-type semiconductor device 100.

A partial cross-sectional view of the first level layer 10 in the first region PR of FIG. 2 may be illustrated. The cross-sectional view of the first level layer 10 may be taken along line A-A' of FIG. 2. The partially cross-sectional view of the second level layer 20 in the second region NR of FIG. 3 may be illustrated. The cross-sectional view of the second level layer 20 may be taken along line B-B' of FIG. 3.

The stack-type semiconductor device 100 includes the first nanosheet stack structure NSS1 stacked on a substrate 101 in the vertical direction (e.g., the Z direction) with respect to a surface 101a of the substrate 101. The substrate 101 may include the active fins 30. For example, the first nanosheet stack structure NSS1 may be disposed on the surface 101a of the substrate 101.

The first nanosheet stack structure NSS1 includes the first nanosheets NS1, a plurality of first gate electrodes GE1, and a plurality of first gate insulating layers GD1. Each of the first nanosheets NS1 has the first length D1 in the horizontal direction (e.g., the X direction), and the plurality of first gate insulating layers GD1 and a plurality of first gate electrodes GE1 are arranged between the first nanosheets NS1 in the vertical direction (e.g., the Z direction). The first gate electrodes GE1 may respectively correspond to the first gate electrodes 32 of FIG. 2.

On one side surface of the first nanosheet stack structure NSS1, a first source/drain region 103 extending in the horizontal direction with respect to the surface 101a of the substrate 101 is formed. For example, the first source/drain region 103 may contact the first nanosheet stack structure NSS1. A first lateral profile F1 of the first source/drain region 103 may be bent in the vertical direction. A central portion of the first lateral profile F1 of the first source/drain area 103 may further protrude in the vertical direction.

A spacer insulating layer 105 may be formed on one side of the first source/drain region 103, for example, a left side of the source/drain region 103, which is on one side surface of the first nanosheet stack structure NSS1. For example, a spacer insulating layer 105 may be formed on only one side of the first source/drain region 103. The first nanosheet stack structure NSS1, the first source/drain region 103, and the spacer insulating layer 105 may be insulated by a first isolation insulating layer 107. The first nanosheet stack structure NSS1, the first source/drain region 103, the spacer insulating layer 105, and the first isolation insulating layer 107 may be formed in the first level layer 10.

In an exemplary embodiment of the present inventive concept, the first nanosheet stack structure NSS1, the first source/drain region 103, and the spacer insulating layer 105 may form the first transistor TR1, for example, the P-type multi-bridge channel transistor MBC1.

In the stack-type semiconductor device 100, the second nanosheet stack structure NSS2 may be stacked on the first nanosheet stack structure NSS1 in the vertical direction (e.g., the Z direction). The second nanosheet stack structure NSS2 may be formed in the second level layer 20 on the substrate 101.

The second nanosheet stack structure NSS2 includes the second nanosheets NS2, a plurality of gate insulating layers GD2, and a plurality of second gate electrodes GE2. Each of the nanosheets NS2 has the second length D2 that is less than the first length D1 in the horizontal direction (e.g., the X direction), and the plurality of second gate insulating layers GD2 and the plurality of second gate electrodes GE2 are arranged between the second nanosheets NS2 in the vertical direction (e.g., the Z direction). The second gate electrodes GE2 may respectively correspond to the second gate electrodes 36 of FIG. 3.

In an exemplary embodiment of the present inventive concept, an etch stop layer 111 may be formed between the first nanosheet stack structure NSS1 and the second nanosheet stack structure NSS2. On one side surface of the second nanosheet stack structure NSS2, the second source/drain region 113 may be formed to extend in the horizontal direction (e.g., the X direction).

A second lateral profile F2 of the second source/drain region 113 may be bent in the vertical direction. A central portion of the second lateral profile F2 of the second source/drain region 113 may further protrude in the vertical direction. A second isolation insulating layer 115A may disposed on the second source/drain region 113 and the second nanosheet stack structure NSS2. For example, the second isolation insulating layer 115 may at least partially surround the second source/drain region 113 and the second nanosheet stack structure NSS2. The second isolation insulating layer 115 may correspond to the second level layer 20.

In an exemplary embodiment of the present inventive concept, the second nanosheet stack structure NSS2 and the second source/drain region 113 may form the second transistor TR2, for example, the N-type multi-bridge channel transistor MBC2.

In the stack-type semiconductor device 100, contact holes 123 and 119 extending in the vertical direction (e.g., the Z direction) are formed on one side of the second source/drain region 113 and one side of the first source/drain region 103. A contact electrode 125 may be buried in the contact holes 123 and 119. The contact electrode 125 may contact one side surface of the first source/drain region 103.

The contact holes 123 and 119 and the contact electrode 125 are described in more detail. The contact holes 123 and 119 may include a first contact hole 123 and a second contact hole 119. The first contact hole 123 may extend along the first source/drain region 103 such that the first source/drain region 103 is exposed in the first contact hole 123. The first contact hole 123 may include a first vertical contact hole 123A on one side of the first source/drain region 103. The contact electrode 125 may include a first vertical contact electrode 125A buried in the first vertical contact hole 123A.

The second contact hole 119 may include a ball-type contact hole 119A and a second vertical contact hole. The ball-type contact hole 119A may be disposed on one side of the second source/drain region 113, and the second vertical contact hole 119B is connected with the ball-type contact hole 119A in the vertical direction (e.g., the Z direction). A ball-type insulating layer 121A and a vertical insulating layer 121B may be respectively formed on inner walls of the ball-type contact hole 119A and the second vertical contact hole 119B. The ball-type insulating layer 121A and the vertical insulating layer 121B form an insulating layer 121 formed on an inner wall of the second contact hole 119. The second vertical contact hole 119B may be spaced apart from one side of the second source/drain region 113 by a first separation distance IS1 in the horizontal direction (e.g., the X direction).

The contact electrode 125 may include a ball-type contact electrode 125B and a second vertical contact electrode 125C respectively buried in the ball-type contact hole 119A and the second vertical contact hole 119B. The ball-type contact electrode 125b may be disposed on the ball-type insulating layer 121A, and the second vertical contact electrode 125C may be disposed on the vertical insulating layer 121B. The second vertical contact electrode 125C may be spaced apart from a side surface of the second source/drain region 113 by a second separation distance IS2 in the horizontal direction (e.g., the X direction).

The ball-type contact electrode 125B may be on an upper portion of the first source/drain region 103 in the vertical direction (e.g., the Z direction). The ball-type contact electrode 125B may be adjacent to a central portion of the second source/drain region 113 in the horizontal direction (e.g., the X direction). The ball-type insulating layer 121A may be between the second source/drain region 113 and the ball-type contact electrode 125B and may insulate the second source/drain region 113 from the ball-type contact electrode 125B.

The ball-type insulating layer 121A may contact the second source/drain region 113. For example, the ball-type insulating layer 121A may contact the central portion of the second source/drain region 113 in the horizontal direction (e.g., the Z direction). The ball-type insulating layer 121A may be greater in thickness than that of the vertical insulating layer 121B because of the structural curvature of the ball-type insulating layer 121A. For example, the thickness of the ball-type insulating layer 121A may be the greatest in a central portion of the curvature of the ball-type insulating layer 121A along the vertical direction.

In the stack-type semiconductor device 100, the first vertical contact electrode 125A, the ball-type contact electrode 125B, and the second vertical contact electrode 125C may be integrated. The first vertical contact electrode 125A, the ball-type contact electrode 125B, and the second vertical contact electrode 125C may be integrated because they are formed through the same manufacturing process described below.

Figure 5:
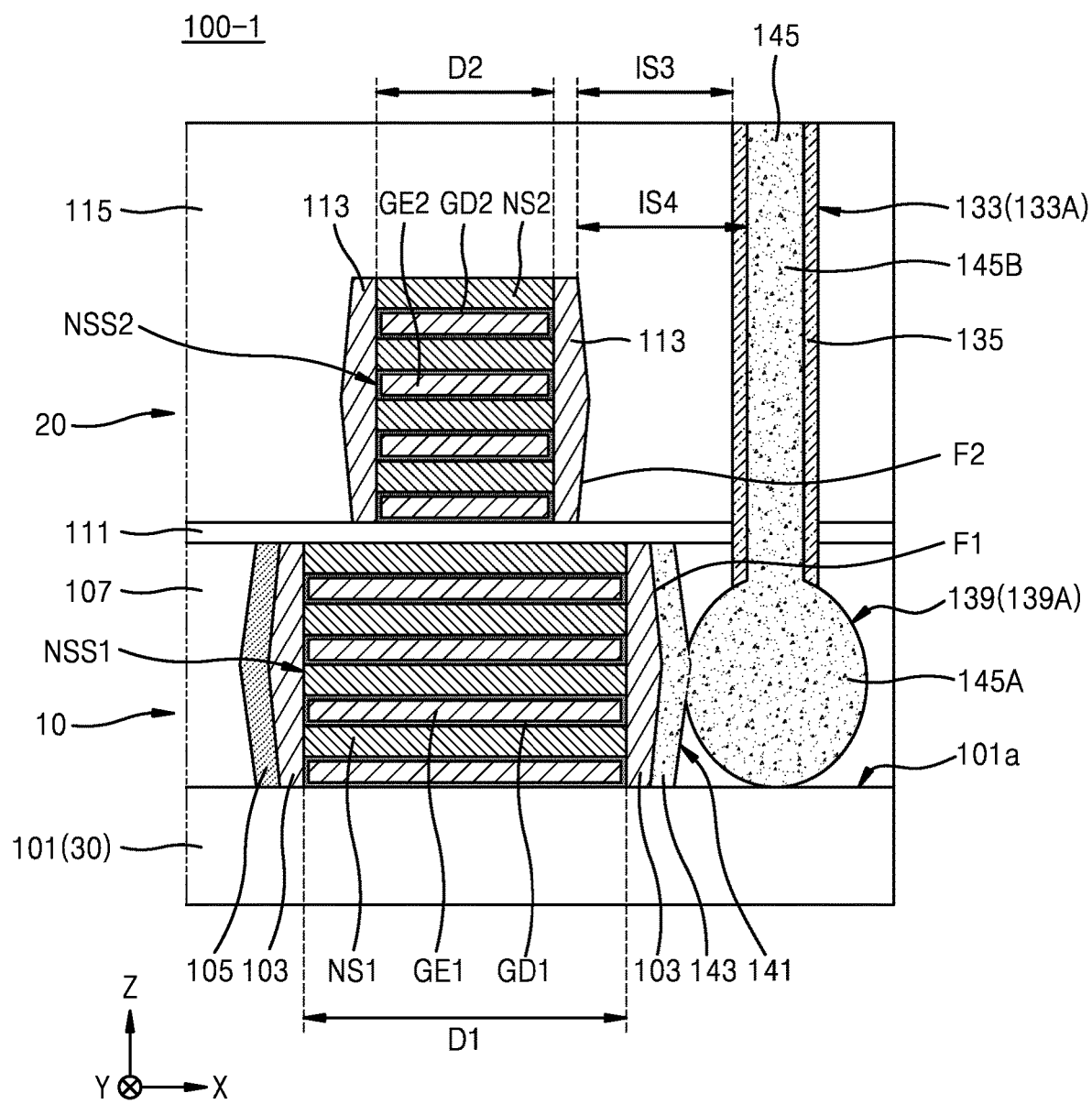
FIG. 5 is a cross-sectional view of a stack-type semiconductor device according to an exemplary embodiment of the present inventive concept.

FIG. 5 is a cross-sectional view of a stack-type semiconductor device according to an embodiment of the present inventive concept.

In detail, FIG. 5 may be a partial cross-sectional view of the stack-type semiconductor device 100 of FIG. 1. FIG. 5 may illustrate a partial cross-sectional view of the second level layer 20 stacked on the first level layer 10 in a stack-type semiconductor device 100-1.

A partial cross-sectional view of the first level layer 10 in the first region PR of FIG. 2 may be illustrated. The cross-sectional view of the first level layer 10 may be taken along line A-A' of FIG. 2. The partially cross-sectional view of the second level layer 20 in the second region NR of FIG. 3 may be illustrated. The cross-sectional view of the second level layer 20 may be taken along line B-B' of FIG. 3.

Compared with the stack-type semiconductor device 100 of FIG. 4, the stack-type semiconductor device 100-1 of FIG. 5 may be the same as the stack-type semiconductor device 100 of FIG. 4 except that the stack-type semiconductor device 100-1 further includes an intermediate electrode 143 and a structure of a contact electrode 145 is different from that of contact electrode 125 of FIG. 4. Like reference numerals in FIGS. 4 and 5 denote like elements. In FIG. 5, the descriptions provided with reference to or that are similar to that of FIG. 4 may be briefly provided or omitted.

The stack-type semiconductor device 100-1 includes the first nanosheet stack structure NSS1 arranged on the substrate 101 in the vertical direction (e.g., the Z direction) with respect to the surface 101a of the substrate 101. On a side surface of the first nanosheet stack structure NSS1, the first source/drain region 103 extending in the horizontal direction with respect to the surface 101a of the substrate 101 is formed. The spacer insulating layer 105 may be formed on one side of the first source/drain region 103, for example, on the left side of the first source/drain region 103, which is on the side surface of the first nanosheet stack structure NSS1.

In the stack-type semiconductor device 100-1, the second nanosheet stack structure NSS2 is stacked on the first nanosheet stack structure NSS1 in the vertical direction (e.g., the Z direction). The second source/drain region 113 extending in the horizontal direction (e.g., the X direction) and the vertical direction (e.g., the Z direction) is formed on one side surface of the second nanosheet stack structure NSS2.

In the stack-type semiconductor device 100-1, an intermediate hole 141 is formed on one side of the first source/drain region 103, and contact holes 139 and 133 extending in the vertical direction (e.g., the Z direction) are formed on one side of the second source/drain region 113 and one side of the first source/drain region 103. The contact holes 139 and 133 communicate with the intermediate hole 141. For example, the contact holes 139 and 133 are connected with the intermediate hole 141. The intermediate electrode 143 is buried in the intermediate hole 141, and the contact electrode 145 is buried in the contact holes 139 and 133. The contact electrode 145 may contact one side surface of the first source/drain region 103 through the intermediate electrode 143.

The intermediate hole 141, the intermediate electrode 143, the contact holes 139 and 133, and the contact electrode 145 are described in more detail. The intermediate hole 141 may be formed on a side of the first source/drain region 103. The intermediate electrode 143 is formed in the intermediate hole 141.

The contact holes 139 and 133 include a first contact hole 139 and a second contact hole 133. The first contact hole 139 may communicate with the intermediate hole 141. For example, the first contact hole 139 may be connected with the intermediate hole 141. The first contact hole 139 may include a ball-type contact hole 139A on one side of the intermediate electrode 143.

The second contact hole 133 may include a vertical contact hole 133A on one side of the second source/drain region 113. The vertical contact hole 133A is separated from one side of the second source/drain region 113 by a third separation distance IS3 in the horizontal direction (e.g., the X direction). An insulating layer 135 is formed on an inner wall of the vertical contact hole 133A.

The contact electrode 145 may include a ball-type contact electrode 145A and a vertical contact electrode 145B respectively buried in the ball-type contact hole 139A and the vertical contact hole 135A in the insulating layer 135. The vertical contact electrode 145B is separated from one side of the second source/drain region 113 by a fourth separation distance IS4 in the horizontal direction (e.g., the X direction).

The ball-type contact electrode 145A may contact the intermediate electrode 143 and may be electrically connected thereto. The ball-type contact electrode 145A may be separated from one side surface of the first source/drain region 103 in the horizontal direction (e.g., the X direction). The ball-type contact electrode 145A may overlap central portions of the first source/drain region 103 and may contact the intermediate electrode 143 in the horizontal direction (e.g., the Z direction).

In the stack-type semiconductor device 100-1, the intermediate electrode 143, the ball-type contact electrode 145A, and the vertical contact electrode 145B may be integrally formed. The intermediate electrode 143, the ball-type contact electrode 145A, and the vertical contact electrode 145B may be integrally formed through a manufacturing process, as described below.

FIGS. 6 to 10 are cross-sectional views of a manufacturing method of a stack-type semiconductor device, according to an embodiment of the present inventive concept.

In detail, FIGS. 6 to 10 illustrate a manufacturing method of the stack-type semiconductor device 100, according to an exemplary embodiment of the present inventive concept, of FIG. 4. Like reference symbols in FIGS. 1 to 4 and FIGS. 6 to 10 denote like elements. In FIGS. 6 to 10, the descriptions provided with reference to or that are similar to that of FIGS. 1 to 4 may be briefly provided or omitted.

Figure 6:
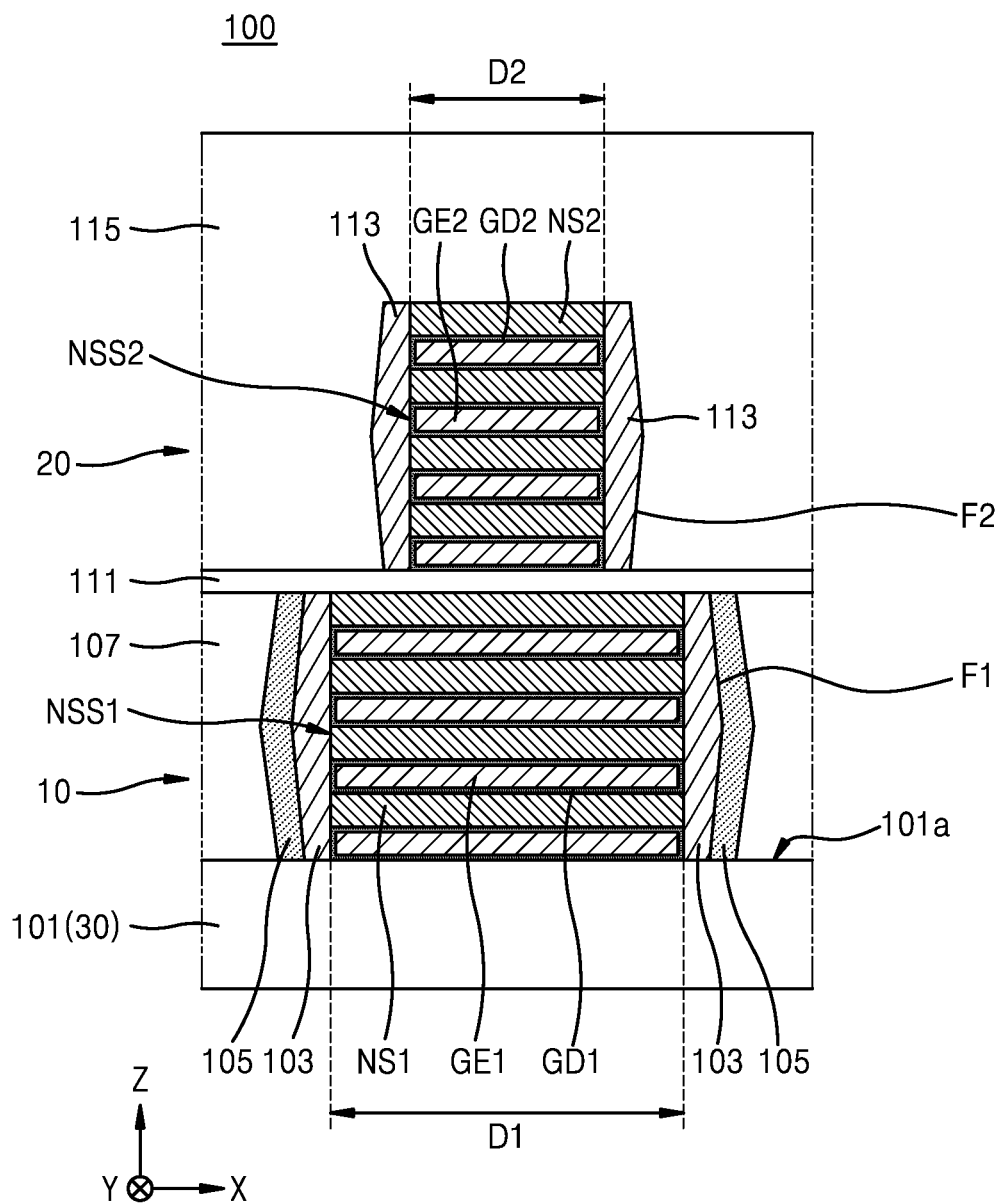
FIGS. 6, 7, 8, 9 and 10 are cross-sectional views of a manufacturing method of a stack-type semiconductor device, according to an exemplary embodiment of the present inventive concept.

Referring to FIG. 6, the substrate 101 is prepared. In an exemplary embodiment of the present inventive concept, the substrate 101 may include a semiconductor such as silicon (Si) or germanium (Ge) or a compound semiconductor such as silicon germanium (SiGe), silicon carbide (SIC), gallium arsenide (GaAs), indium arsenide (InAs), or indium phosphide (InP). In an exemplary embodiment of the present inventive concept, the substrate 101 may include at least one of III-V group materials and IV group materials.

The III-V group material may be a binary, tertiary, or quaternary compound including at least one III group element and at least one V group element. The III-V group material may be a compound including at least one of In, Ga, and/or aluminum (Al) as a III group element and at least one of As, P, and/or antimony (Sb) as a V group element.

For example, the III-V group material may be selected from among InP, $In_zGa_{1-z}As$ ($0 \leq z \leq 1$), and $Al_zGa_{1-z}As$ ($0 \leq z \leq 1$). The binary compound may be, for example, any one of InP, GaAs, InAs, indium antimonide (InSb), and/or gallium antimonide (GaSb). The tertiary compound may be any one of indium gallium phosphide (InGaP), indium gallium arsenide (InGaAs), aluminum indium arsenide (AlInAs), indium gallium antimonide (InGaSb), gallium arsenide antimonide (GaAsSb), and/or gallium arsenide phosphide (GaAsP). The IV group material may be Si or Ge. However, the III-V group materials and the IV group materials that may be used in the stack-type semiconductor device 100 are not limited thereto.

The III-V group material and the IV group material such as Ge may be used as channel materials for forming low-power and high-speed transistors. A high-performance CMOS may be formed by using a semiconductor substrate including a III-V group material, e.g., GaAs, which has a higher electron mobility than a Si substrate, and a semiconductor substrate including a semiconductor material, e.g., Ge, which has higher hole mobility than a Si substrate. In an exemplary embodiment of the present inventive concept, the substrate 101 may have a Silicon On Insulator (SOI) structure. In the present embodiment, the substrate 101 may use a Si substrate.

The first nanosheet stack structure NSS1 is formed on the substrate 101. The substrate 101 may have the surface 101a. The substrate 101 may include the active fins 30. As described above, the first nanosheet stack structure NSS1 includes the nanosheets NS1, the first gate insulating layers GD1, and the first gate insulating layers GD1. Each of the nanosheets NS1 has the first length D1 in the horizontal direction (e.g., the X direction), and the first gate insulating layers GD1 and the first gate electrodes GE1 arranged between the first nanosheets NS1 in the vertical direction (e.g., the Z direction).

The first nanosheets NS1 may include Si. The first gate insulating layers GD1 may include high-k dielectric layers. The high-k dielectric layer may include a material having a greater dielectric constant than that of a silicon oxide layer. For example, the high-k dielectric layer may have a dielectric constant ranging from about 10 to about 25.

The high-k dielectric layer may include a material selected from among hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof, but materials for forming the high-k dielectric layer are not limited thereto.

The high-k dielectric layer may be formed through, for example, Atomic Layer Deposition (ALD), Chemical Vapor Deposition (CVD), or Physical Vapor Deposition (PVD). The high-k dielectric layer may have a thickness ranging from about 10 Å to about 40 Å, but the present inventive concept is not limited thereto.

The first gate electrode GE1 may include at least one of conductive metal nitride (e.g., titanium nitride or tantalum nitride) and a metal material (e.g., Ti, Ta, W, Cu, or Al).

In the present embodiment, it is illustrated that the first nanosheet stack structure NSS1 includes four first nanosheets NS1. However, this is merely an example, and an exemplary embodiment of the present inventive concept are not limited thereto. The first source/drain region 103 is formed on both side surfaces of the first nanosheet stack structure NSS1. Because the first source/drain region 103 is formed by epitaxially growing a semiconductor layer doped with impurities, the first lateral profile F1 of the first source/drain region 103 may have a bent configuration in which a central portion of the first lateral profile F1 protrudes.

In an exemplary embodiment of the present inventive concept, the first source/drain region 103 may include a Si layer, a Ge layer, a SiGe layer, a silicon boride (SiB) layer, a silicon phosphide (SiP) layer, a silicon carbon phosphide (SiCP) layer, or a combination thereof.

The spacer insulating layer 105 is formed on one side surface of the first source/drain region 103 formed on both side surfaces of the first nanosheet stack structure NSS1. The spacer insulating layer 105 may include, for example, silicon nitride.

The first isolation insulating layer 107 is formed on the spacer insulating layer 105 on both sides of the first nanosheet stack structure NSS1. The first isolation insulating layer 107 may include, for example, silicon oxide.

The first nanosheet stack structure NSS1, the first source/drain region 103, and the spacer insulating layer 105 may be insulated by the first isolation insulating layer 107. The first level layer 10 may include the first nanosheet stack structure NSS1, the first source/drain region 103, the spacer insulating layer 105, and the first isolation insulating layer 107.

The etch stop layer 111 is formed on the first nanosheet stack structure NSS1, the first source/drain region 103, the spacer insulating layer 105, and the first isolation insulating layer 107. The etch stop layer 111 may be omitted. The etch stop layer 111 may include, for example, silicon nitride.

The second nanosheet stack structure NSS2 is formed on the etch stop layer 111. The second nanosheet stack structure NSS2 includes the second nanosheets NS2, the second gate insulating layer GD2, and the second gate electrode GE2. Each of the second nanosheets NS2 has the second length D2 that is less than the first length D1 in the horizontal direction (the X direction), and the second gate insulating layers GD2 and the second gate electrodes GE2 are arranged between the second nanosheets NS2 in the vertical direction (e.g., the Z direction).

The second nanosheets NS2, the second gate insulating layers GD2, and the second gate electrodes GE2 may include the same materials as the first nanosheets NS1, the first gate insulating layers GD1, and the second gate electrodes GE1, respectively.

In the present embodiment, it is illustrated that the second nanosheet stack structure NSS2 includes four second nanosheets NSS2. However, this is merely an example, and an exemplary embodiment of the present inventive concept is not limited thereto. The second source/drain region 113 is formed on both side surfaces of the second nanosheet stack structure NSS2. Because the second source/drain region 113 is formed by epitaxially growing a semiconductor layer doped with impurities, the second lateral profile F2 of the second source/drain region 113 may have a bent configuration in which a central portion of the second lateral profile F2 protrudes.

In an exemplary embodiment of the present inventive concept, the second source/drain region 113 may include a Si layer, a Ge layer, a SiGe layer, a SiB layer, a SiP layer, a SiCP layer, or a combination thereof.

A second isolation insulating layer 115 is formed in the second source/drain region 113 on both side surfaces of the second nanosheet stack structure NSS2. The second nanosheet stack structure NSS2 and the second source/drain region 113 may be insulated by the second isolation insulating layer 115. The second level layer 20 may include the second nanosheet stack structure NSS2, the second source/drain region 113, and the second isolation insulating layer 115. The second isolation insulating layer 115 may include, for example, silicon oxide.

Figure 7:
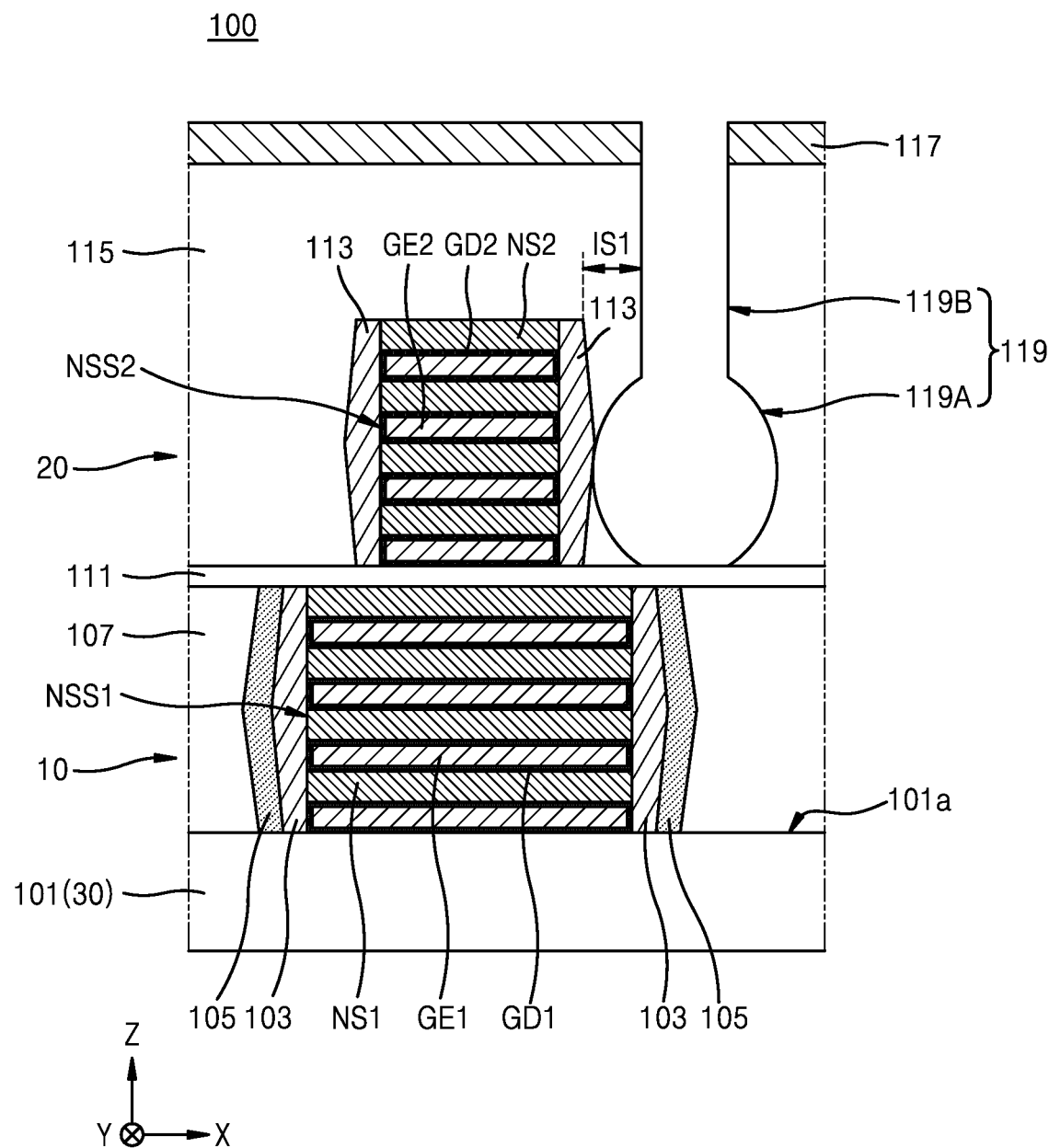

Referring to FIG. 7, a mask pattern 117 is formed on the second isolation insulating layer 115. The mask pattern 117 may include, for example, silicon nitride, polysilicon, a spin-on hardmask (SOH) material, or a combination thereof, but the present inventive concept is not limited thereto. In an exemplary embodiment of the present inventive concept, the SOH material may include a hydrocarbon compound or a derivative thereof, wherein the hydrocarbon compound has a relatively high carbon content of about 85 wt % to about 99 wt % relative to the total weight of the SOH material.

Then, the second isolation insulating layer 115 is etched by using the mask pattern 117 as an etch mask to form the second contact hole 119 in the second level layer 20. The second contact hole 119 may include the ball-type contact hole 119A on one side of the second source/drain region 113 and the second vertical contact hole 119B connected with the ball-type contact hole 119A in the vertical direction (e.g., the Z direction). The ball-type contact hole 119A may contact one side of the second source/drain region 113.

For example, the ball-type contact hole 119A may contact the central portion of the second source/drain region 113. The second vertical contact hole 119B may be separated from one side of the second source/drain region 113 by the first separation distance IS1 in the horizontal direction (e.g., the X direction).

The ball-type contact hole 119A and the second vertical contact hole 119B, which form the second contact hole 119, may be formed by over-etching the second isolation insulating layer 115 by using the mask pattern 117 as the etch mask. The bottom of the second contact hole 119 may be on the etch stop layer 111.

The ball-type contact hole 119A may be formed by etching the second isolation insulating layer 115 in a ball shape. For example, the ball-type contact hole 119A may be formed by isotropically etching the second isolation insulating layer 115. For example, the second vertical contact hole 119B may be formed by anisotropically etching the second isolation insulating layer 115.

Figure 8:
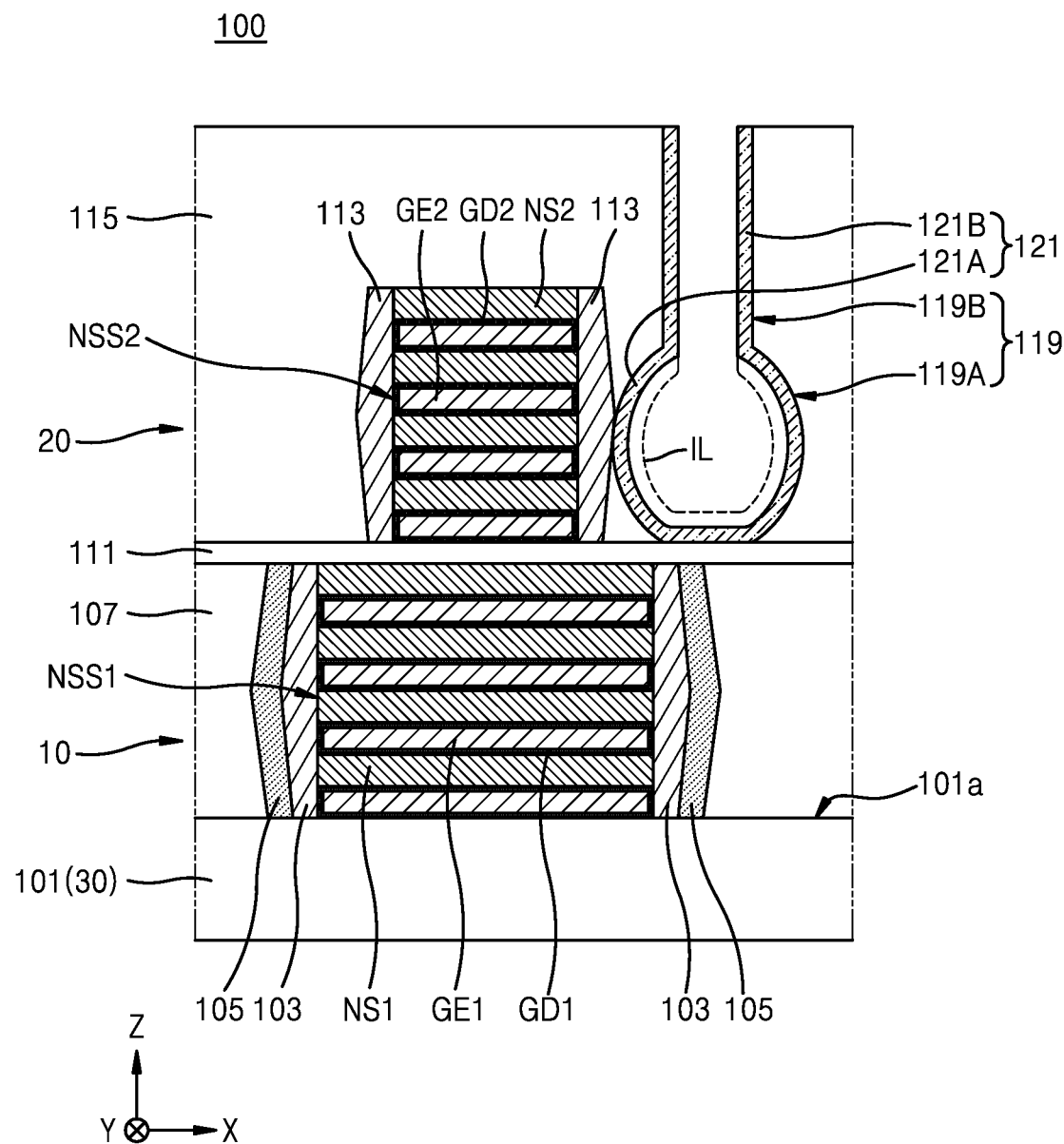

Referring to FIG. 8, the mask pattern (117 of FIG. 7) is removed. However, in an exemplary embodiment of the present inventive concept, the mask pattern (117 of FIG. 7) might not be removed. The insulating layer 121 is formed on the inner wall of the second contact hole 119. The insulating layer 121 may include, for example, silicon nitride. The insulating layer 121 includes a ball-type insulating layer 121A and a vertical insulating layer 121B respectively formed on the inner walls of the ball-type contact hole 119A and the second vertical contact hole 119B.

The ball-type insulating layer 121A may contact one side of the second source/drain region 113. As indicated by the reference symbol IL in FIG. 8, the ball-type insulating layer 121A may be greater in thickness than the vertical insulating layer 121B. In other words, the ball-type insulating layer 121A formed in the ball-type contact hole 119A may be greater in thickness than the vertical insulating layer 121B formed in the second vertical contact hole 119B, according to manufacturing processes. When the thickness of the ball-type insulating layer 121A is greater, the contact electrode 125, which is formed later, may be insulated from the second source/drain region 113.

Figure 9:
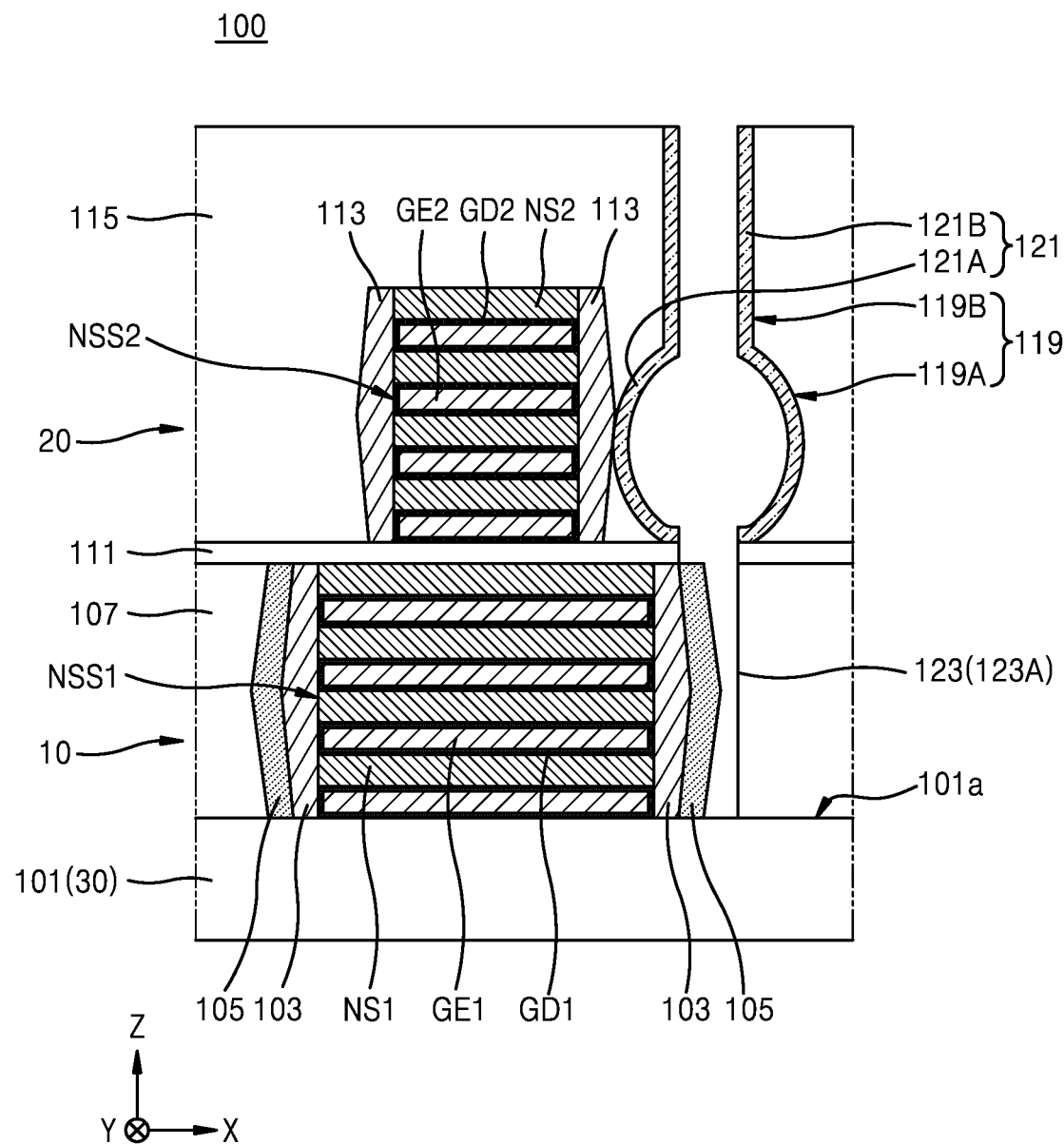

Referring to FIG. 9, the ball-type insulating layer 121A, the etch stop layer 111, and the first isolation insulating layer 107 are etched on a lower portion of the bottom of the ball-type contact hole 119a. Accordingly, the first contact hole 123 exposing the spacer insulating layer 105 is formed, and the spacer insulating layer 105 is on the first source/drain region 103, which is on one side of the first nanosheet stack structure NSS1. In an exemplary embodiment of the present inventive concept, the spacer insulating layer 105 may be exposed on the lower portion of the bottom of the ball-type contact hole 119A.

The first contact hole 123 may communicate with the second contact hole 119 in the vertical direction (e.g., the Z direction). The first contact hole 123 may be formed at the bottom of the second contact hole 119. The first contact hole 123 may be formed in the first level layer 10. The first contact hole 123 may include the first vertical contact hole 123A on one side of the first source/drain region 103.

Figure 10:
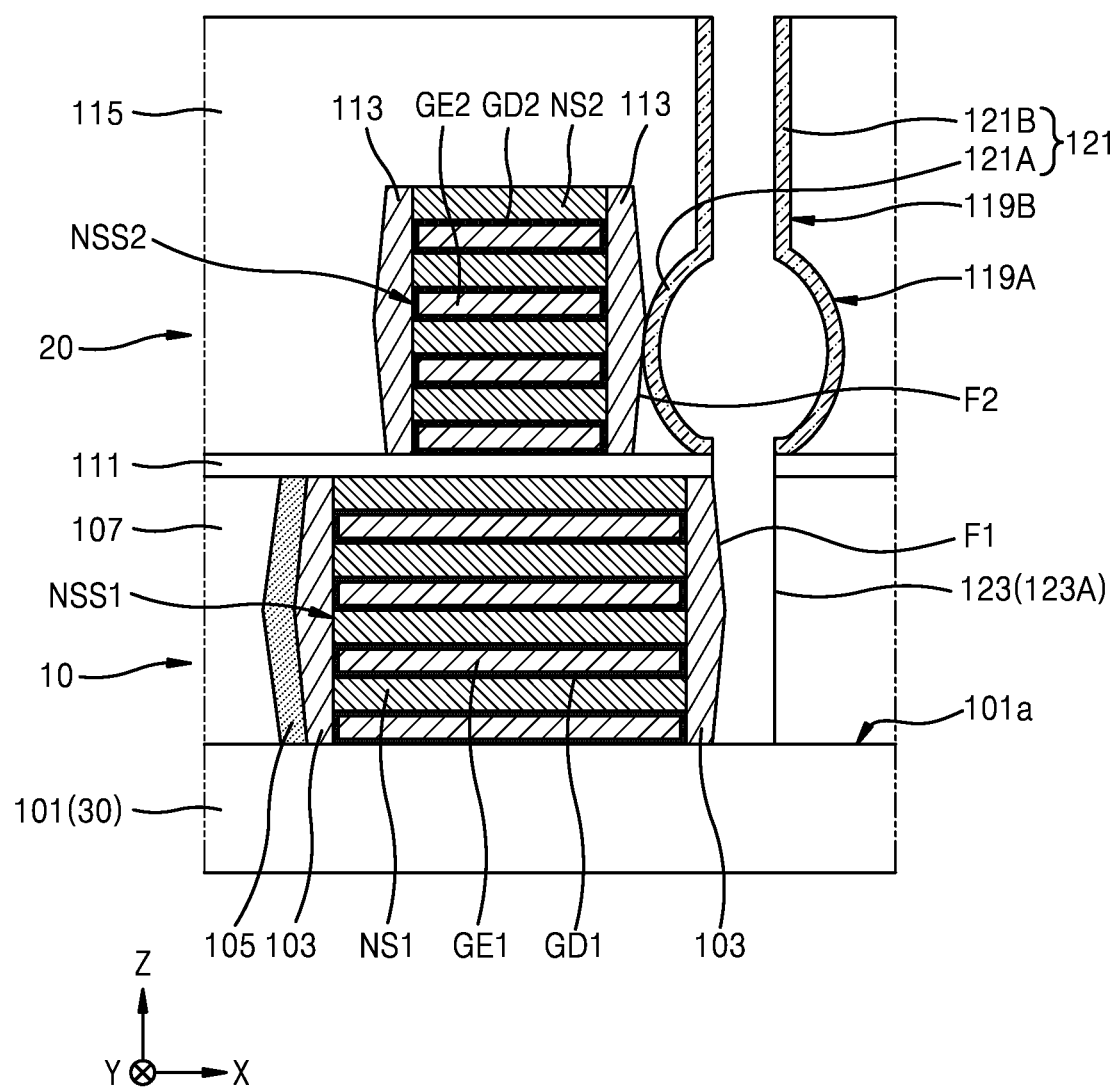

Referring to FIG. 10, the spacer insulating layer (105 of FIG. 9) in the first contact hole 123 is removed. In this case, an area of the first contact hole 123 increases, and thus, a contact resistance of a contact electrode formed later may decrease.

As illustrated in FIG. 4, the contact electrode 125 is formed by burying metal materials inside the first contact hole 123 and the second contact hole 119 in which the insulating layer 121 is formed. The contact electrode 125 may contact one side surface of the first source/drain region 103. The contact electrode 125 may include at least one of conductive metal nitride (e.g., titanium nitride or tantalum nitride) and/or a metal material (e.g., Ti, Ta, W, Cu, or Al).

As described above, the contact electrode 125 may include a first vertical contact electrode 125A, a ball-type contact electrode 125B, and a second vertical contact electrode 125C. The contact electrode 125A may be buried inside the first vertical contact hole 123A, and the ball-type contact electrode 125B may be buried inside the ball-type contact hole 119A and on the ball-type insulating layer 121A. The second vertical contact electrode 125C may be buried inside the second vertical contact hole 119B. For example, the first vertical contact electrode 125A, the ball-type contact electrode 125B, and the second vertical contact electrode 125C may be integrally formed through one manufacturing process.

FIGS. 11 to 15 are cross-sectional views of a manufacturing method of a stack-type semiconductor device, according to an exemplary embodiment of the present inventive concept.

In detail, FIGS. 11 to 15 illustrate an embodiment of a manufacturing method of the stack-type semiconductor device 100-1 of FIG. 5. Like reference symbols in FIGS. 1, 3, and 5 and FIGS. 11 to 15 denote like elements. In FIGS. 11 to 15, the descriptions provided with reference to or that are similar to that of FIGS. 1, 3, and 5 may be briefly provided or omitted.

Figure 11:
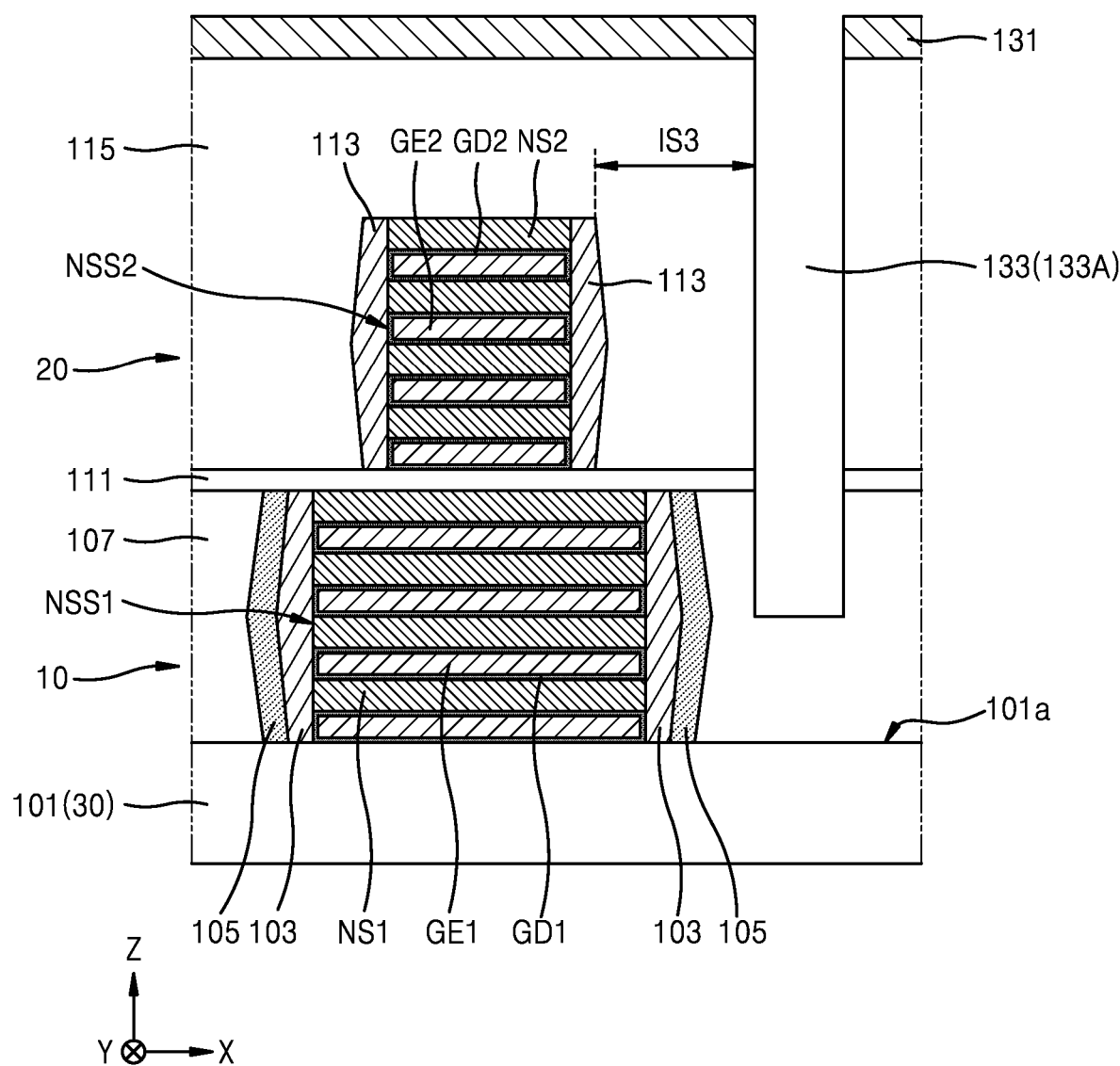
FIGS. 11, 12, 13, 14 and 15 are cross-sectional views of a manufacturing method of a stack-type semiconductor device, according to an exemplary embodiment of the present inventive concept.

Referring to FIG. 11, as described above with reference to FIG. 6, the first nanosheet stack structure NSS1, the first source/drain region 103, the spacer insulating layer 105, and the first isolation insulating layer 107 are formed on the substrate 101. The first level layer 10 including the first nanosheet stack structure NSS1, the first source/drain region 103, the spacer insulating layer 105, and the first isolation insulating layer 107 is formed.

After the etch stop layer 111 is formed on the first level layer 10, the second level layer 20 is formed on the etch stop layer 111. The second level layer 20 includes the second nanosheet stack structure NSS2, the second source/drain region 113, and the second isolation insulating layer 115.

A mask pattern 131 is formed on the second isolation insulating layer 115. The mask pattern 131 may include the same material as the mask pattern (117 of FIG. 7) described above.

Then, the second isolation insulating layer 115 and the first isolation insulating layer 107 are etched by using the mask pattern 131 as an etch mask to form the second contact hole 133. The second contact hole 133 may penetrate the second isolation insulating layer 115 and the first isolation insulating layer 107. For example, the bottom of the second contact hole 133 may be on a central portion of a portion of the first isolation insulating layer 107 on a side of the first nanosheet NS1, for example, the right side.

The bottom of the second contact hole 133 may be spaced apart from one side of the spacer insulating layer 105 in the horizontal direction (e.g., the X direction). The second contact hole 133 may be the vertical contact hole 133A located on one side of the second source/drain region 113. The vertical contact hole 133A may be spaced apart from one side of the second source/drain region 113 by the third separation distance IS3 in the horizontal direction (e.g., the X direction).

Figure 12:
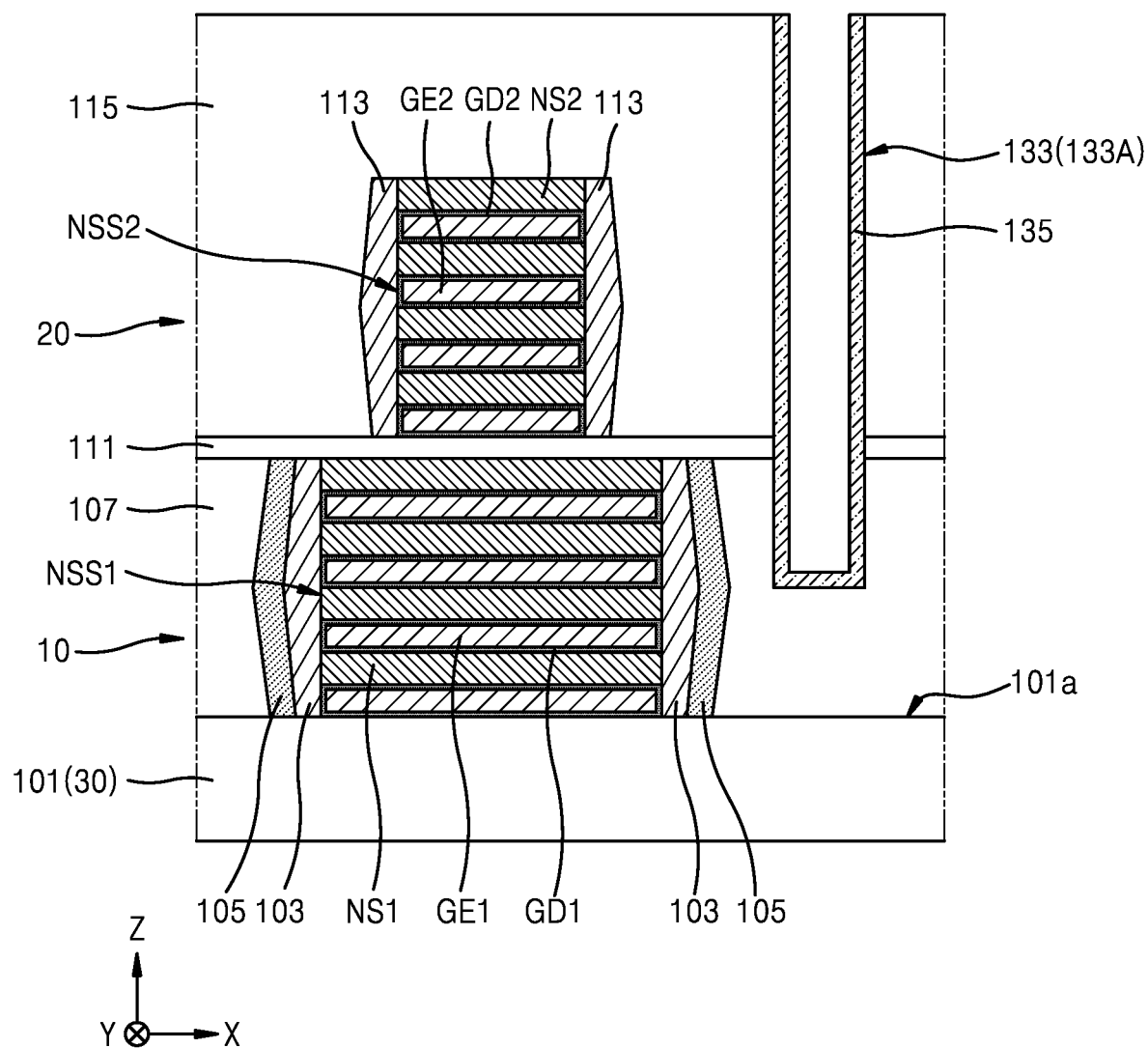
Figure 13:
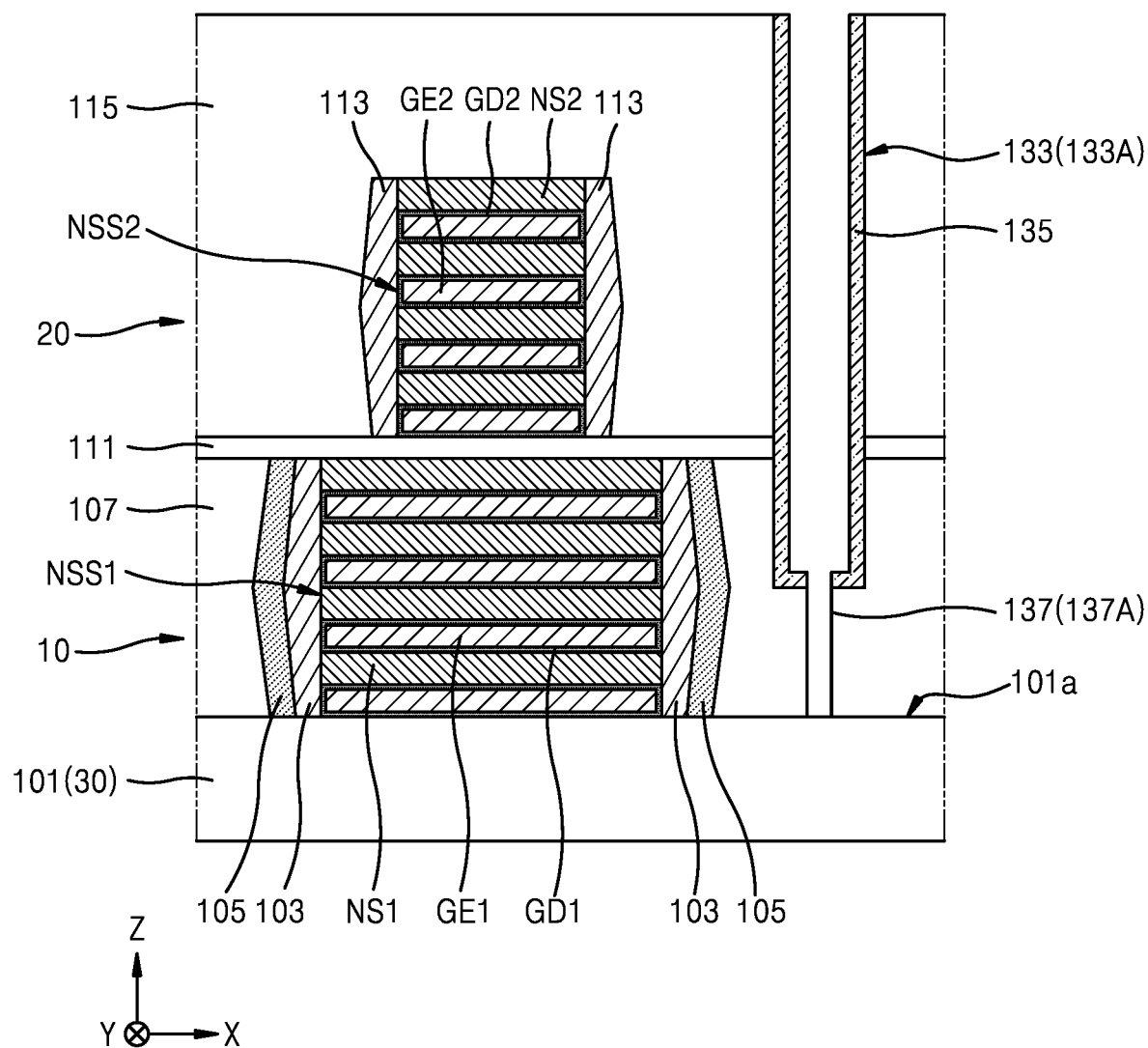

Referring to FIGS. 12 and 13, as illustrated in FIG. 12, the mask pattern (131 of FIG. 11) is removed. However, in an exemplary embodiment of the present inventive concept, the mask pattern (131 of FIG. 11) might not be removed. Then, an insulating layer 135 is formed on both sidewalls and the bottom of the second contact hole 133. The insulating layer 135 may include, for example, silicon nitride. The insulating layer 135 may be a vertical insulating layer formed on the inner wall of the second vertical contact hole 133A.

As illustrated in FIG. 13, a first preliminary contact hole 137 is formed by etching the insulating layer 135, which is at the bottom of the second contact hole 133, and the first isolation insulating layer 107 located under the bottom of the second contact hole 133.

The first preliminary contact hole 137 may be spaced apart from one side of the spacer insulating layer 105 in the horizontal direction (e.g., the X direction). The first preliminary contact hole 137 may include a vertical contact hole 137A. For example, the first preliminary contact hole 137 may be formed by anisotropically etching the second isolation insulating layer 115.

Figure 14:
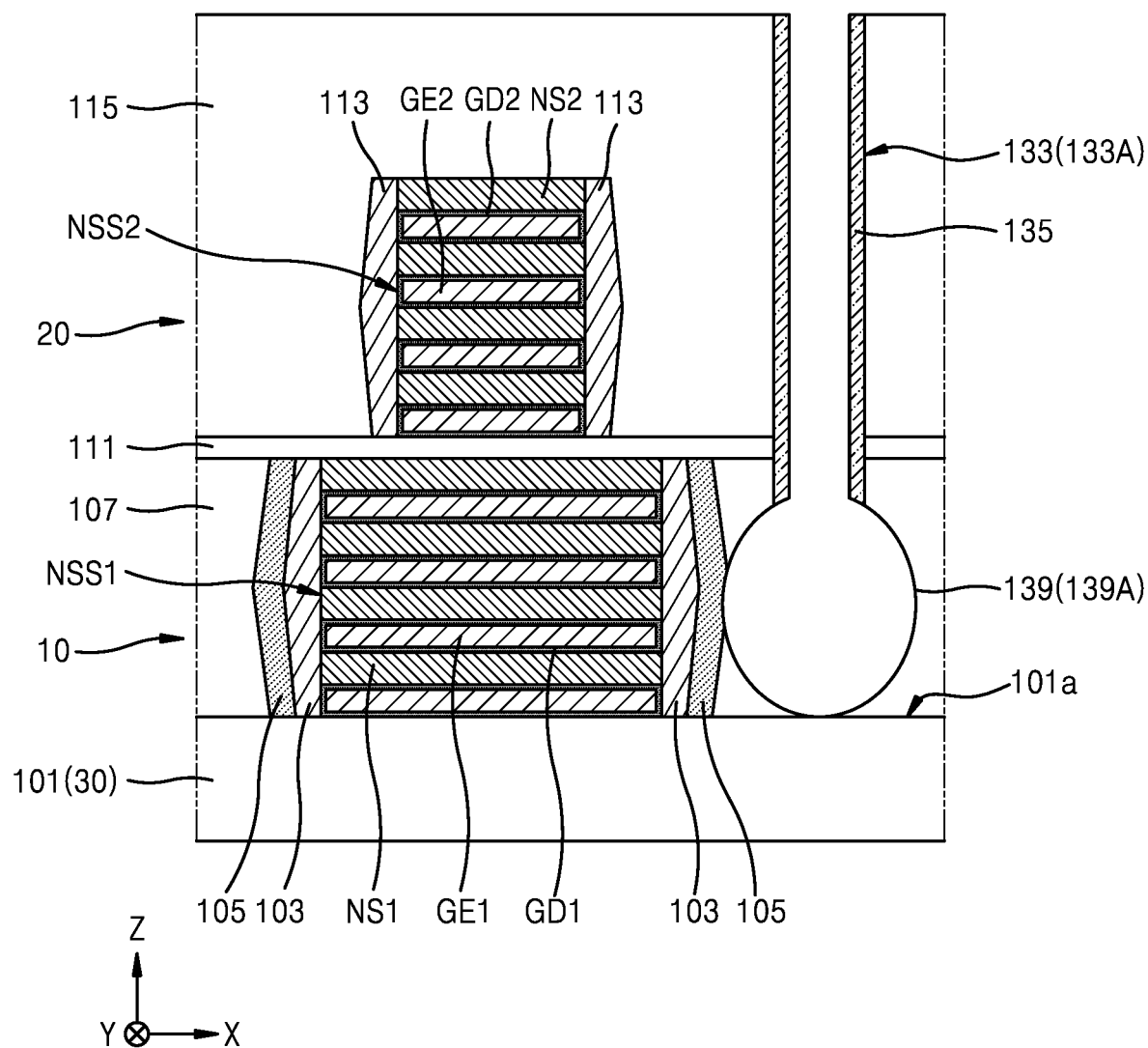

Referring to FIG. 14, the first contact hole 139 is formed by further expanding the first preliminary contact hole 137 and the second contact hole 133 that are adjacent to the spacer insulating layer 105 of the first nanosheet stack structure NSS1. The first contact hole 139 may be formed by providing an etch gas or an etchant through the second contact hole 133 and the first preliminary contact hole 137 and further etching the first isolation insulating layer 107.

The first contact hole 139 may be formed by isotropically etching the first isolation insulating layer 107. The first contact hole 139 may be formed by over-etching the first isolation insulating layer 107. When the first preliminary contact hole 137 and the second contact hole 133 further expand, the area of the first contact hole 139 may increase, and thus, the contact resistance of the contact electrode 145, which is formed later, may decrease.

The first contact hole 139 may include the ball-type contact hole 139A arranged adjacent to the spacer insulating layer 105. The ball-type contact hole 139A may be formed by etching the first isolation insulating layer 107 into a ball shape. For example, the ball-type contact hole 139A may be formed by isotropically etching the first isolation insulating layer 107.

The ball-type contact hole 139A may be adjacent to part of the spacer insulating layer 105. For example, the ball-type contact hole 139A may contact the central portion of the spacer insulating layer 105. The ball-type contact hole 139A may communicate with the second contact hole 133 in the vertical direction (e.g., the Z direction).

Figure 15:
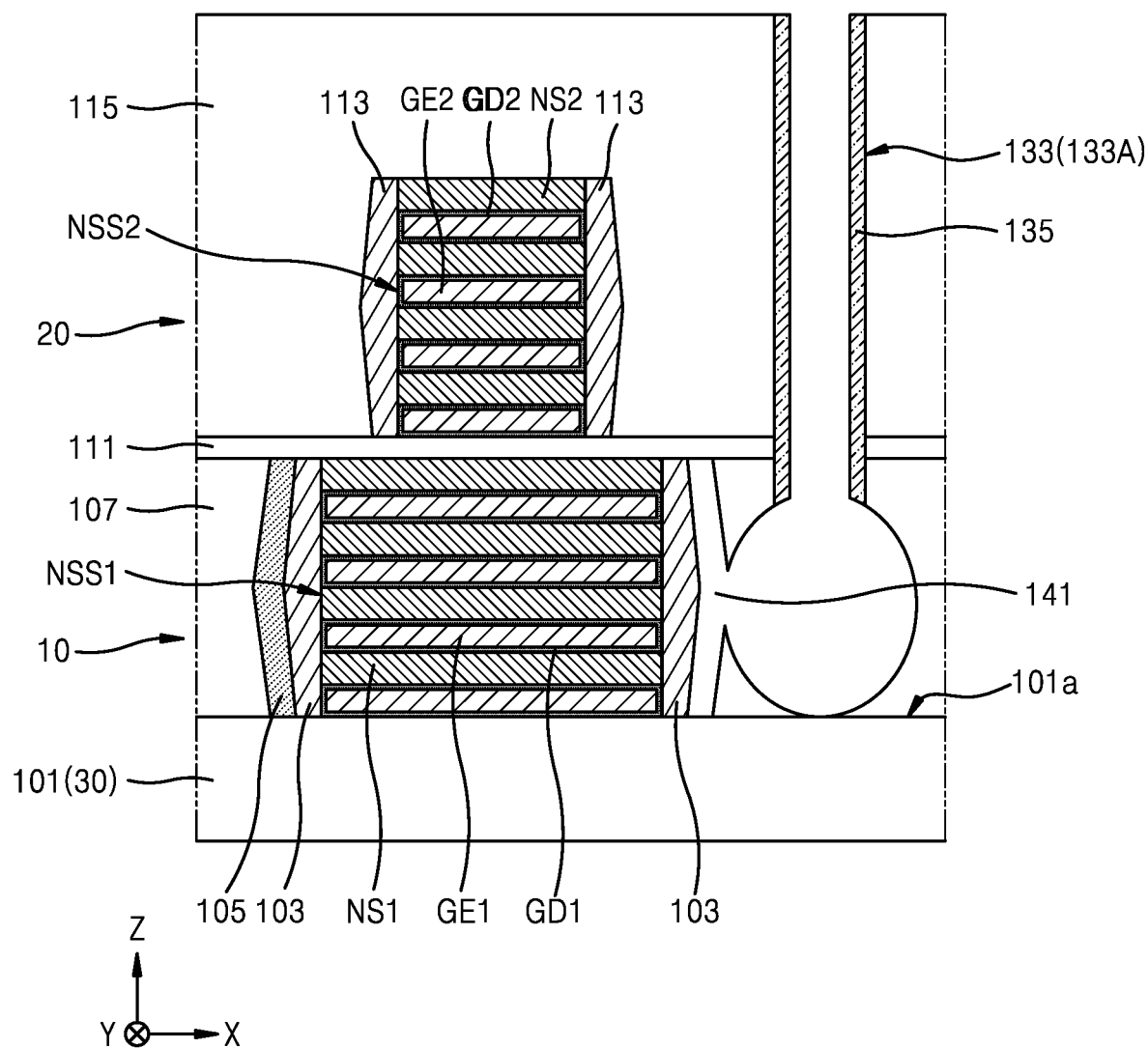

Referring to FIG. 15, the intermediate hole 141 is formed by removing the spacer insulating layer (105 of FIG. 14) contacting the first contact hole 139. For example, the spacer insulating layer (105 of FIG. 14) may be removed through dry or wet etching. The intermediate hole 141 may communicate with the first contact hole 139. For example, the intermediate hole 141 may be connected to the first contact hole 139. The intermediate hole 141 may be adjacent to one side of the first source/drain region 103.

As illustrated in FIG. 5, the intermediate electrode 143 and the contact electrode 145 are formed by burying a metal material in the second contact hole 133 in which the intermediate hole 141, the first contact hole 139, and the insulating layer 135 are formed. The contact electrode 145 may contact one side surface of the first source/drain region 103 through the intermediate electrode 143.

The intermediate electrode 143 and the contact electrode 145 may each include at least one of conductive metal nitride (e.g., titanium nitride or tantalum nitride) and/or a metal material (e.g., Ti, Ta, W, Cu, or Al).

As described above, the contact electrode 145 may include the ball-type contact electrode 145A and the vertical contact electrode 145B respectively buried in the ball-type contact hole 139A and the vertical contact hole 135A. In addition, the ball-type contact electrode 145A and the vertical contact electrode 145B may be disposed on the insulating layer 135. For example, the intermediate electrode 143, the ball-type contact electrode 145A, and the vertical contact electrode 145B may be integrally formed through one manufacturing process.

Figure 16:
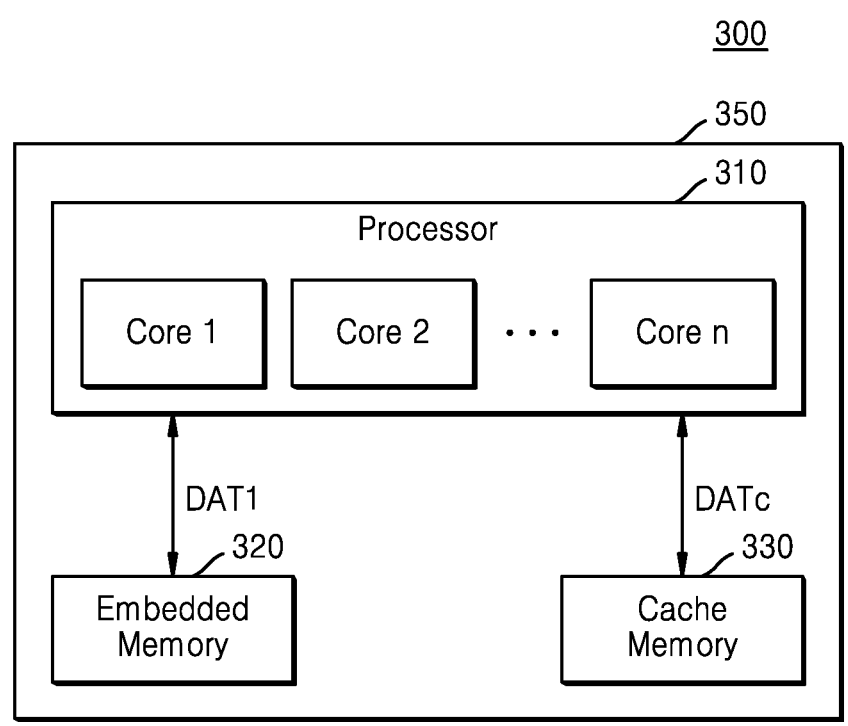
FIG. 16 is a block diagram of a structure of an electronic device including a stack-type semiconductor device, according to an exemplary embodiment of the present inventive concept.

FIG. 16 is a block diagram of a structure of an electronic device including a stack-type semiconductor device, according to an exemplary embodiment of the present inventive concept.

In detail, an electronic device 300 may include a semiconductor chip 350. The semiconductor chip 350 may include a processor 310, embedded memory 320, and cache memory 330.

The processor 310 may include one or more processor cores Core 1 to Core n. The processor cores Core 1 to Core n may process data and signals. The processor cores Core 1 to Core n may include the stack-type semiconductor devices 100 and 100-1 and may include the logic cells described with reference to FIG. 1.

The electronic device 300 may perform unique functions using the processed data and signals. For example, the processor 310 may be an application processor. The embedded memory 320 may exchange first data DATI with the processor 310. The first data DATI may be data processed or to be processed by the processor cores Core 1 to Core n. The embedded memory 320 may manage the first data DATI. For example, the embedded memory 320 may perform buffering on the first data DATI. The embedded memory 320 may function as buffer memory or working memory of the processor 310.

According to an exemplary embodiment of the present inventive concept, the electronic device 300 may be applied to a wearable electronic device. The wearable electronic device may perform more functions requiring a small amount of operations than functions requiring a large amount of operations. When the electronic device 300 is applied to a wearable electronic device, the embedded memory 320 might not have to include a large buffer capacity.

The embedded memory 320 may be Static RAM (SRAM). SRAM may operate at a higher speed than DRAM. When the SRAM is embedded in the semiconductor chip 350, the electronic device 300 having a small size and operating at high speed may be realized. Furthermore, when the SRAM is embedded in the semiconductor chip 350, the amount of consumed active power of the electronic device 300 may decrease. For example, the SRAM may include the stack-type semiconductor devices 100 and 100-1 according to an exemplary embodiment of the present inventive concept.

The cache memory 330 may be mounted on the semiconductor chip 350 together with the processor cores Core 1 to Core n. The cache memory 330 may store cache data DATc therein. The cache data DATc may be data used by the processor cores Core 1 to Core n. The cache memory 330 may have a low storage capacity, but may operate at a considerably high speed.

For example, the cache memory 330 may include the stack-type semiconductor devices 100 and 100-1 according to an exemplary embodiment of the present inventive concept. The cache memory 330 may include SRAM. When the cache memory 330 is used, the number of times and the time the processor 310 accesses the embedded memory 320 may decrease. Therefore, when the cache memory 330 is used, the operation speed of the electronic device 300 may increase.

In the drawing, it is illustrated that the cache memory 330 is separated from the processor 310. However, the cache memory 330 may be included in the processor 310. The processor 310, the embedded memory 320, and the cache memory 330 may transmit data according to various interface protocols. For example, the processor 310, the embedded memory 320, and the cache memory 330 may transmit data according to one or more interface protocols from among Universal Serial Bus (USB), Small Computer System Interface (SCSI), Peripheral Component Interconnect (PCI) Express, Advanced Technology Attachment (ATA), Parallel ATA (PATA), Serial ATA (SATA), Serial Attached SCSI (SAS), Integrated Drive Electronics (IDE), and Universal Flash Storage (UFS).

Figure 17:
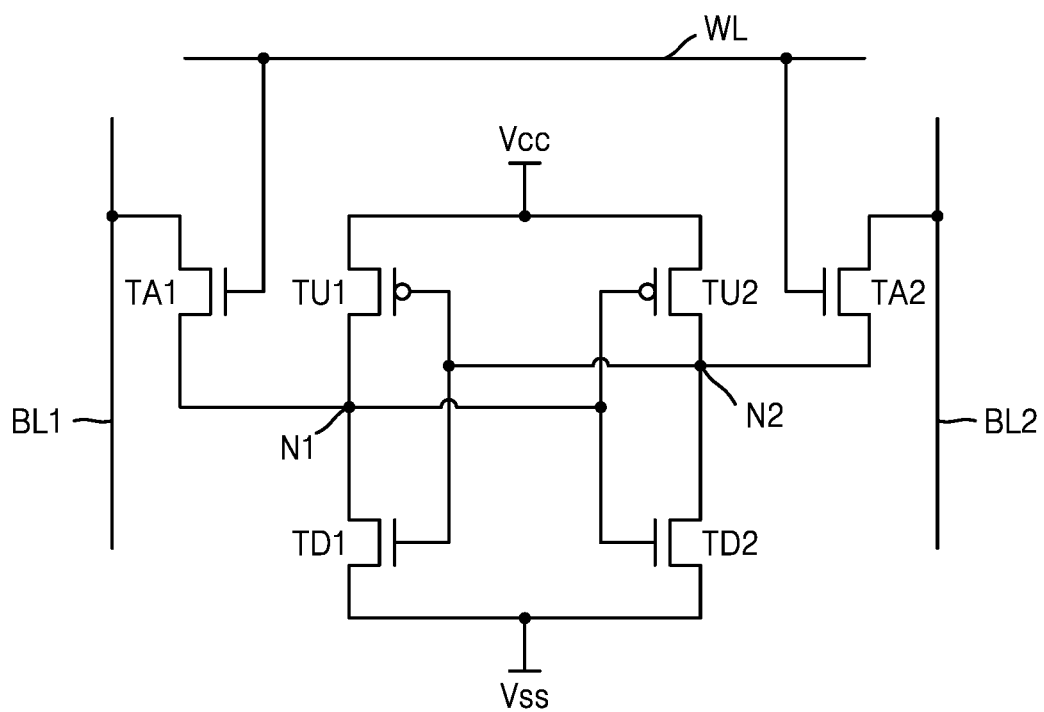
FIG. 17 is a circuit diagram of a Static Random Access Memory (SRAM) cell using a stack-type semiconductor device, according to an exemplary embodiment of the present inventive concept.

FIG. 17 is a circuit diagram of an SRAM cell using a stack-type semiconductor device, according to an exemplary embodiment of the present inventive concept.

In detail, the SRAM cell of FIG. 17 may be realized using the stack-type semiconductor devices 100 and 100-1 according to an exemplary embodiment of the present inventive concept. For example, the SRAM cell may be applied to the embedded memory 320 and/or the cache memory 330 described with reference to FIG. 16.

The SRAM cell may include a first pull up transistor TU1, a first pull down transistor TD1, a second pull up transistor TU2, a second pull down transistor TD2, a first access transistor TA1, and a second access transistor TA2.

The first and second pull up transistors TU1 and TU2 may each be a PMOS transistor, whereas the first and second pull down transistors TD1 and TD2 and the first and second access transistors TA1 and TA2 may each be an NMOS transistor.

A first source/drain (or a first source and drain region) of the first pull up transistor TU1 and a first source/drain of the first pull down transistor TD1 may be connected to a first node N1. A second source/drain (or a second source and drain region) of the first pull up transistor TU1 may be connected to a power line Vcc, and a second source/drain of the first pull down transistor TD1 may be connected to a ground line Vss.

A gate of the first pull up transistor TU1 may be electrically connected to a gate of the first pull down transistor TD1. Thus, the first pull up transistor TU1 and the first pull down transistor TD1 may configure a first inverter. The gates of the first pull up transistor TU1 and the first pull down transistor TD1 may correspond to input terminals of the first inverter, and the first node N1 may correspond to an output terminal of the first inverter.

A first source/drain of the second pull up transistor TU2 and a first source/drain of the second pull down transistor TD2 may be connected to a second node N2. A second source/drain of the second pull up transistor TU2 may be connected to the power line Vcc, and a second source/drain of the second pull down transistor TD2 may be connected to the ground line Vss.

A gate of the second pull up transistor TU2 may be electrically connected to a gate of the second pull down transistor TD2. Thus, the second pull up transistor TU2 and the second pull down transistor TD2 may configure a second inverter. The gates of the second pull up transistor TU2 and the second pull down transistor TD2 may correspond to input terminals of the second inverter, and the second node N2 may correspond to an output terminal of the second inverter.

The first and second inverters may be combined to form a latch structure. For example, the gates of the first pull up transistor TU1 and the first pull down transistor TD1 may be electrically connected to the second node N2, and the gates of the second pull up transistor TU2 and the second pull down transistor TD2 may be electrically connected to the first node N1.

A first source/drain of the first access transistor TA1 may be connected to the first node N1, and a second source/drain of the first access transistor TA1 may be connected to a first bit line BL1. A first source/drain of the second access transistor TA2 may be connected to the second node N2, and a second source/drain of the second access transistor TA2 may be connected to a second bit line BL2. Gates of the first and second access transistors TA1 and TA2 may be electrically connected to a word line WL. Thus, the SRAM cell may be realized using the stack-type semiconductor devices 100 and 100-1.

While the present inventive concept has been described with reference to embodiments thereof, it will be understood by those of ordinary skill in the art that various changes in form and details may be made thereto without departing from the spirit and scope of the present inventive concept.

What is claimed is:

1. A stack-type semiconductor device comprising:
   a first nanosheet stack structure arranged on a substrate;
   a first source/drain region extending on a side surface of the first nanosheet stack structure;
   a second nanosheet stack structure stacked on the first nanosheet stack structure;

a second source/drain region extending on a side surface of the second nanosheet stack structure;

a contact hole adjacent to a side surface of the second source/drain region and a side surface of the first source/drain region and extending in a vertical direction with respect to a surface of the substrate; and a contact electrode disposed in the contact hole, wherein the contact electrode contacts the side surface of the first source/drain region, wherein the contact electrode comprises a ball-type contact electrode that is spaced apart from the side surface of the second source/drain region.

2. The stack-type semiconductor device of claim 1, wherein the first nanosheet stack structure comprises a plurality of first nanosheets, a plurality of first gate insulating layers, and a plurality of first gate electrodes, wherein each of the plurality of first nanosheets has a first length in a horizontal direction with respect to the surface of the substrate, wherein the plurality of first gate insulating layers and the plurality of first gate electrodes are arranged between the plurality of first nanosheets in the vertical direction, wherein the second nanosheet stack structure comprises a plurality of second nanosheets, a plurality of second gate insulating layers, and a plurality of second gate electrodes, wherein each of the plurality of second nanosheets has a second length that is less than the first length in the horizontal direction, and wherein the plurality of second gate insulating layers and the plurality of second gate electrodes are arranged between the plurality of second nanosheets.

3. The stack-type semiconductor device of claim 1, wherein lateral profiles of the first and second source/drain regions are bent in the vertical direction.

4. The stack-type semiconductor device of claim 1, wherein an etch stop layer is disposed between the first nanosheet stack structure and the second nanosheet stack structure.

5. The stack-type semiconductor device of claim 1, wherein the ball-type contact electrode is spaced apart from the side surface of the second source/drain region in a horizontal direction with respect to the surface of the substrate, and wherein a ball-type insulating layer is arranged between the second source/drain region and the ball-type contact electrode.

6. The stack-type semiconductor device of claim 1, wherein the contact hole comprises a ball-type contact hole on the side of the second source/drain region, wherein a ball-type insulating layer is disposed on an inner wall of the ball-type contact hole, and wherein the contact electrode comprises a ball-type contact electrode disposed in the ball-type contact hole and on the ball-type insulating layer.

7. The stack-type semiconductor device of claim 6, wherein the ball-type contact electrode is arranged on an upper portion of the first source/drain region.

8. The stack-type semiconductor device of claim 1, wherein the contact hole comprises a vertical contact hole on the side surface of the first source/drain region, and the contact electrode comprises a vertical contact electrode disposed in the vertical contact hole.

9. The stack-type semiconductor device of claim 1, wherein an intermediate electrode is disposed on the side surface of the first source/drain region, and wherein the contact electrode contacts the first source/drain region through the intermediate electrode.

10. The stack-type semiconductor device of claim 9, wherein the contact hole comprises a ball-type contact hole on a side surface of the intermediate electrode, and wherein the ball-type contact electrode is disposed in the ball-type contact hole.

11. The stack-type semiconductor device of claim 9, wherein the contact hole comprises a vertical contact hole spaced apart from the second source/drain region, and wherein the contact electrode is disposed in the vertical contact hole.

12. A stack-type semiconductor device comprising:
a first nanosheet stack structure arranged on a substrate;
a first source/drain region disposed on a side surface of the first nanosheet stack structure;
a second nanosheet stack structure stacked on the first nanosheet stack structure;
a second source/drain region disposed on a side surface of the second nanosheet stack structure;
a contact hole contacting a first side surface of the second source/drain region and a first side surface of the first source/drain region, and extending in a vertical direction with respect to a surface of the substrate; and
a contact electrode disposed in the contact hole, wherein the contact electrode directly contacts the first side surface of the first source/drain region,
wherein the contact electrode comprises a ball-type contact electrode that is spaced apart from the first side surface of the second source/drain region.

13. The stack-type semiconductor device of claim 12, wherein the contact electrode is spaced apart from the first side surface of the second source/drain region in a horizontal direction with respect to the surface of the substrate, and wherein a ball-type insulating layer is arranged between the second source/drain region and the contact electrode.

* * * * *